United States Patent
Abe

(10) Patent No.: US 10,249,519 B2
(45) Date of Patent: Apr. 2, 2019

(54) LIGHT-IRRADIATION HEAT TREATMENT APPARATUS

(71) Applicant: SCREEN Holdings Co., Ltd., Kyoto (JP)

(72) Inventor: Makoto Abe, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 65 days.

(21) Appl. No.: 15/420,134

(22) Filed: Jan. 31, 2017

(65) Prior Publication Data

US 2017/0243771 A1 Aug. 24, 2017

(30) Foreign Application Priority Data

Feb. 24, 2016 (JP) .................... 2016-032733

(51) Int. Cl.
| | | |
|---|---|---|
| *F26B 3/30* | (2006.01) | |
| *F26B 19/00* | (2006.01) | |
| *H01L 21/67* | (2006.01) | |
| *H05B 3/00* | (2006.01) | |

(52) U.S. Cl.
CPC ...... *H01L 21/67115* (2013.01); *H05B 3/0047* (2013.01)

(58) Field of Classification Search
None
See application file for complete search history.

(56) References Cited

U.S. PATENT DOCUMENTS

| 4,698,486 A | 10/1987 | Sheets ................... 250/492.2 |
| 5,160,575 A | 11/1992 | Chen .................... 156/620.7 |
| 6,448,536 B2 * | 9/2002 | Li ................. H01L 21/67103 118/50.1 |

(Continued)

FOREIGN PATENT DOCUMENTS

| JP | 60-258928 | 12/1985 |
| JP | 2005-527972 | 9/2005 |

(Continued)

OTHER PUBLICATIONS

Taiwan Decision of Grant dated Aug. 29 2017 for Taiwan Application No. 106100111 and Taiwan search report with English translation thereof.

*Primary Examiner* — Thor S Campbell
(74) *Attorney, Agent, or Firm* — Ostrolenk Faber LLP

(57) ABSTRACT

A semiconductor wafer held by a holder within a chamber is irradiated and heated with halogen light emitted from multiple halogen lamps. A cylindrical louver made of opaque quartz and a light-shielding member of a ring shape having a cut-out portion are provided between the halogen lamps and the semiconductor wafer. When the semiconductor wafer is heated with the light emitted from the halogen lamps, a shadow region will appear in the semiconductor wafer as a result of the louver blocking off the emitted light. However, in the presence of the cut-out portion of the light-shielding member, the light emitted from the halogen lamps will reach the shadow region through the cut-out portion. This configuration allows the shadow region to be heated in the same manner as the other regions, and accordingly will help make uniform the in-plane temperature distribution of the semiconductor wafer during light irradiation heating.

4 Claims, 16 Drawing Sheets

(56) References Cited

U.S. PATENT DOCUMENTS

| | | | |
|---|---|---|---|
| 8,918,303 B2* | 12/2014 | Timans | G01J 5/0003 |
| | | | 702/99 |
| 2002/0148824 A1 | 10/2002 | Hauf et al. | 219/411 |
| 2003/0183612 A1 | 10/2003 | Timans et al. | 219/390 |
| 2003/0230562 A1 | 12/2003 | Yoshimura | 219/405 |
| 2004/0112885 A1* | 6/2004 | Shigeoka | H01L 21/67115 |
| | | | 219/388 |
| 2005/0272228 A1 | 12/2005 | Ito et al. | 438/487 |
| 2013/0078822 A1 | 3/2013 | Yokouchi | 438/795 |
| 2013/0203269 A1* | 8/2013 | Yokouchi | H01L 21/26 |
| | | | 438/795 |
| 2015/0132863 A1 | 5/2015 | Oohashi | |
| 2015/0340257 A1* | 11/2015 | Brillhart | H01L 21/67201 |
| | | | 392/416 |
| 2016/0027671 A1* | 1/2016 | Ranish | G02B 6/00 |
| | | | 392/416 |
| 2017/0213751 A1 | 7/2017 | Oohashi | |

FOREIGN PATENT DOCUMENTS

| | | |
|---|---|---|
| JP | 2012-174879 | 9/2012 |
| TW | 1250587 | 3/2006 |
| TW | 201344740 A | 11/2013 |

* cited by examiner

F I G . 1 0
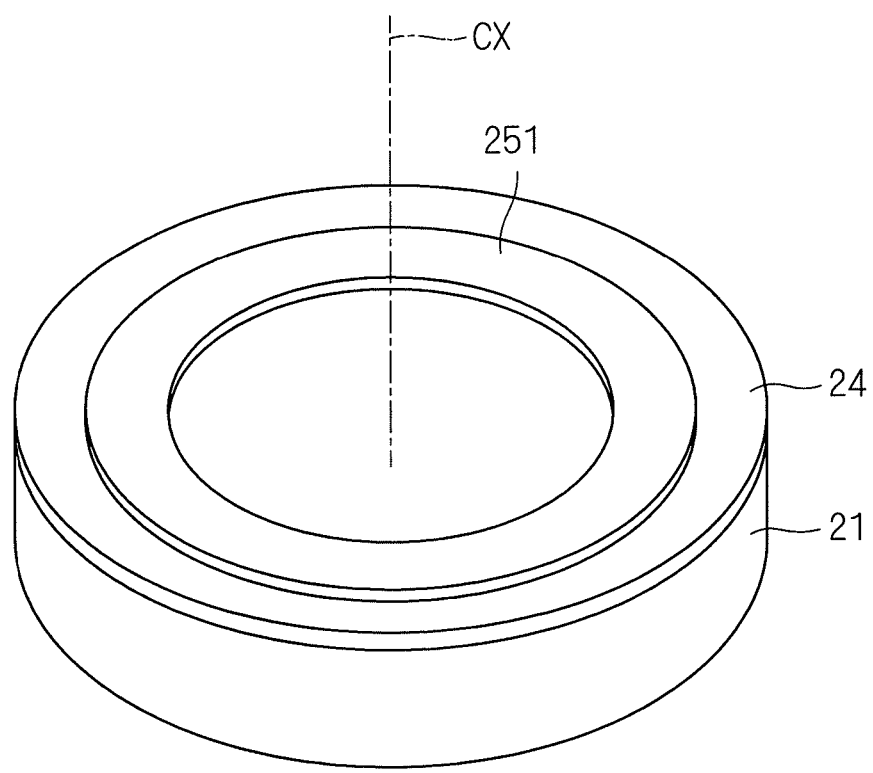

F I G . 1 1
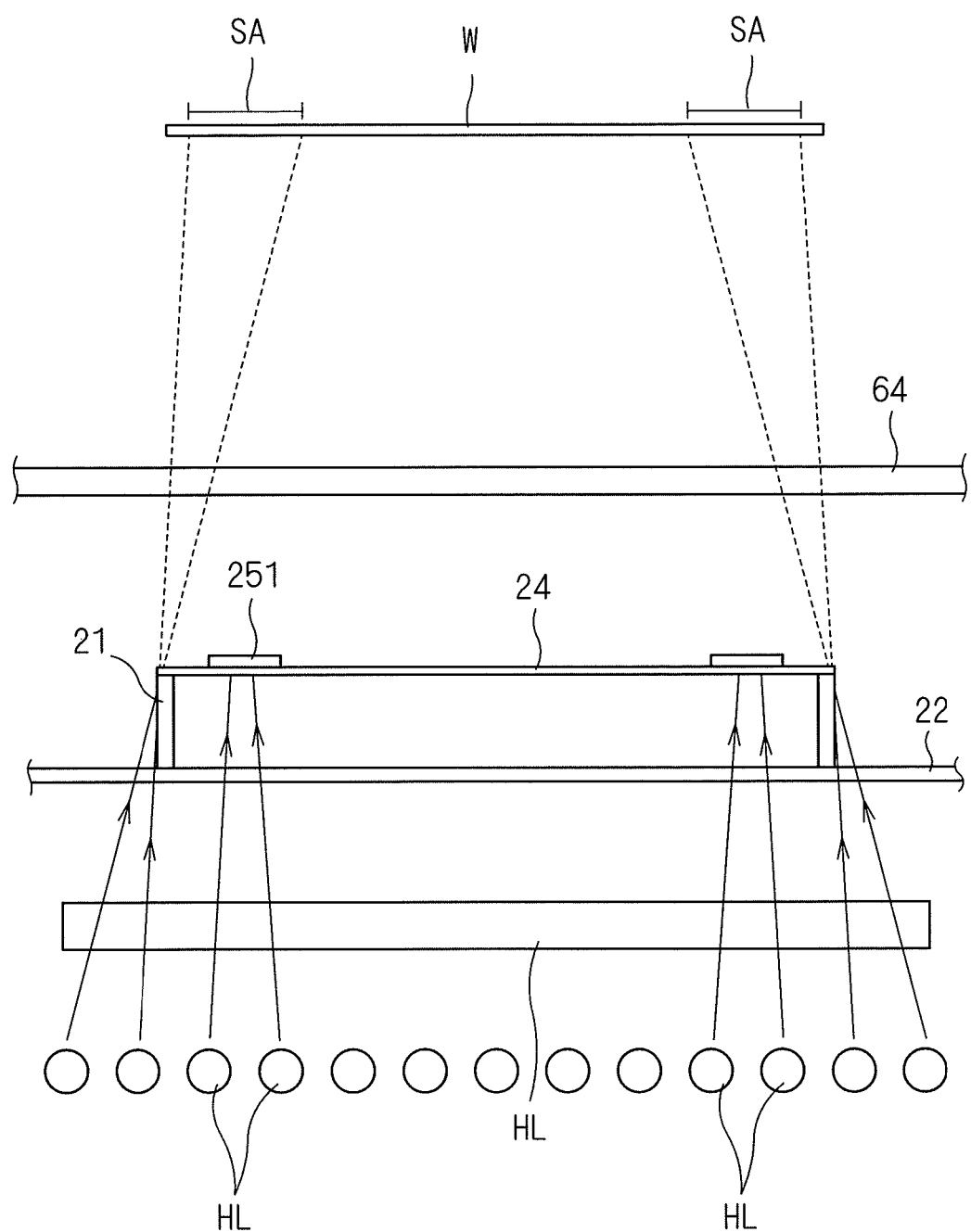

F I G. 1 5
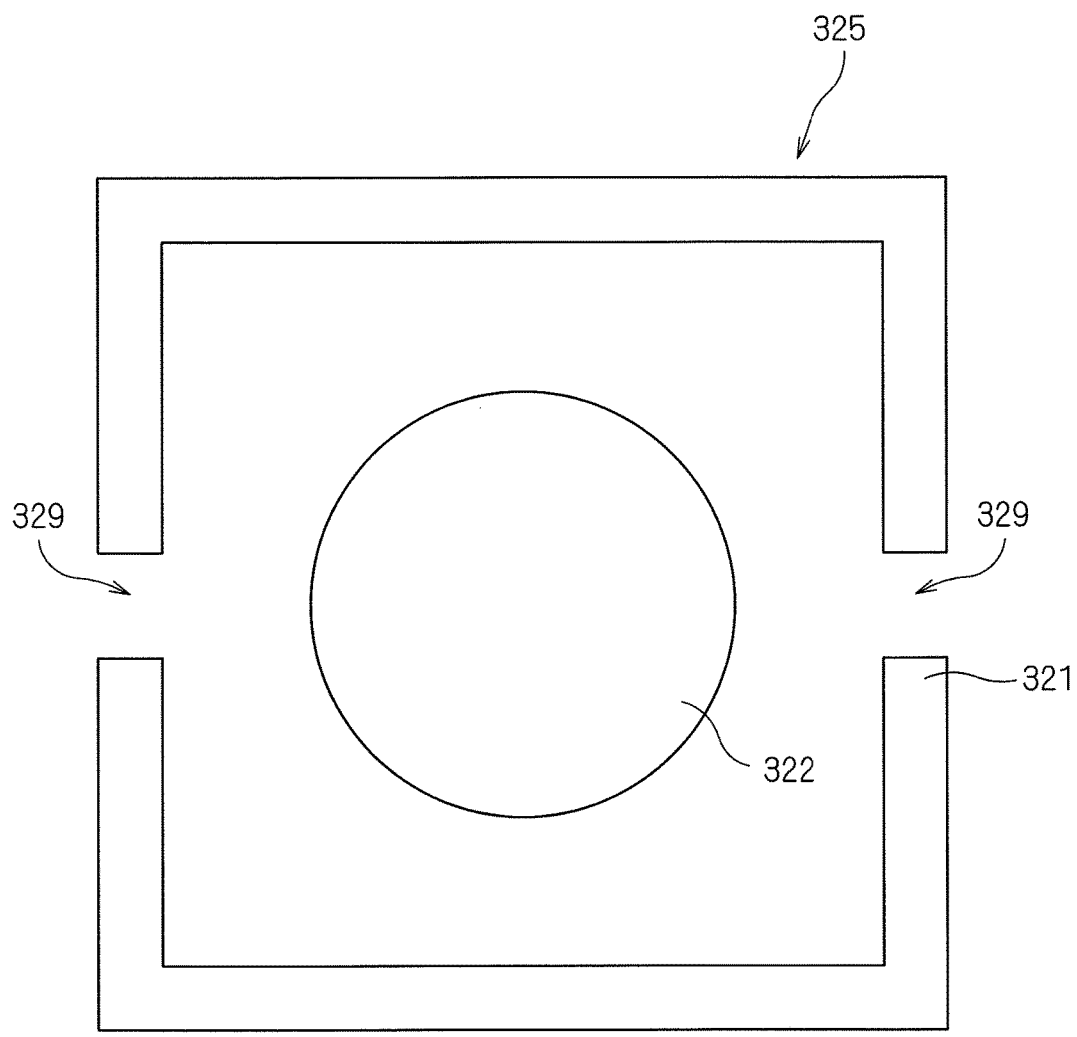

F I G . 1 6
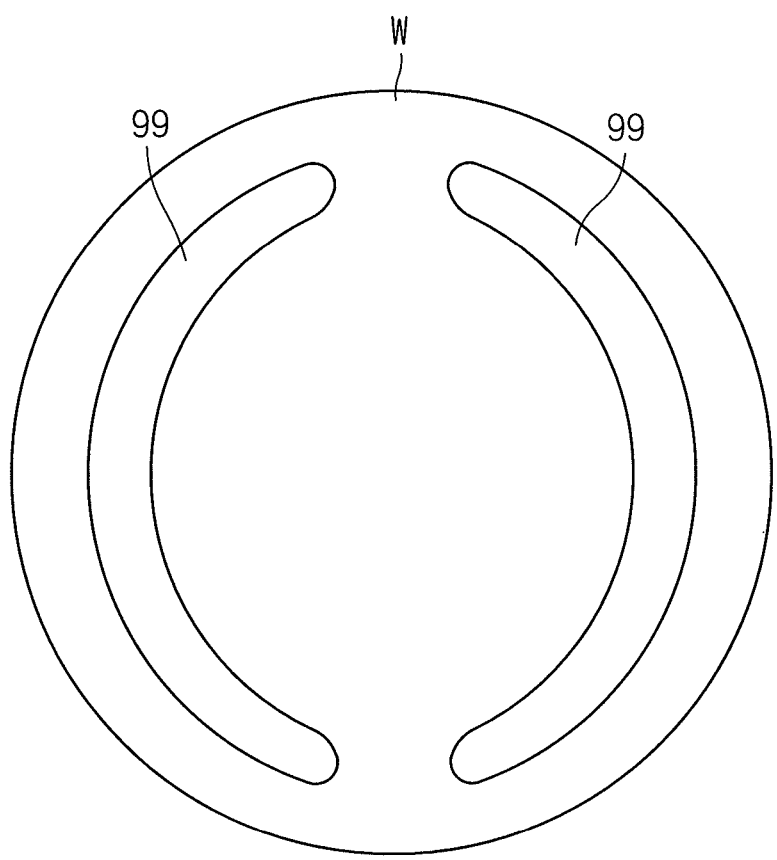

LIGHT-IRRADIATION HEAT TREATMENT APPARATUS

BACKGROUND OF THE INVENTION

Field of the Invention

The present invention relates to a heat treatment apparatus for heating a sheet precision electronic substrate (hereinafter, simply referred to as a "substrate"), such as a disk-shaped semiconductor wafer, by irradiating the substrate with light.

Description of the Background Art

In the process of manufacturing a semiconductor device, the introduction of impurities is an essential step for forming pn junctions in a semiconductor wafer. It is common at present to introduce impurities by ion implantation and subsequent annealing. Ion implantation is a technique for physically doping a semiconductor wafer with impurities by ionizing impurity elements, such as boron (B), arsenic (As), or phosphorus (P), and causing the impurity elements to collide with the semiconductor wafer with a high acceleration voltage. The doped impurities are activated by annealing. At this time, if the annealing time is about several seconds or longer, the doped impurities may be diffused deeply by heat, and as a result, the junction depth may become too deeper than required and compromise the formation of a good device.

In view of this, flash-lamp annealing (FLA) is recently receiving attention as an annealing technique for heating semiconductor wafers in an extremely short time. Flash-lamp annealing is a heat treatment technique using xenon flash lamps (hereinafter, sometimes simply referred to as "flash lamps") to irradiate a surface of an impurity-doped semiconductor wafer with flash light and raise the temperature of only the surface of the semiconductor wafer in an extremely short time (e.g., several milliseconds or less).

The radiation spectral distribution of xenon flash lamps ranges from ultraviolet to near-infrared regions, with the xenon flash lamps having shorter wavelengths than conventional halogen lamps, and approximately coincides with the fundamental absorption band of silicon semiconductor wafers. Thus, when xenon flash lamps emit flash light to a semiconductor wafer, less light will pass through the semiconductor wafer and accordingly the temperature of the semiconductor wafer will rise quickly. It is also known that extremely short-time application of flash light, such as several milliseconds or less, will only selectively increase the temperature in the vicinity of the surface of the semiconductor wafer. Such an extremely short-time temperature rise caused by the xenon flash lamps will only activate impurities without deeply diffusing the impurities.

Examples of the heat treatment apparatus using xenon flash lamps include those disclosed in U.S. Pat. No. 4,698,486 and US 2003/0183612, in which desired heat treatment is achieved by a combination of pulsed light-emitting lamps, such as flash lamps, that are arranged on the front side of a semiconductor wafer and continuous lighting lamps, such as halogen lamps, that are arranged on the rear side of the semiconductor wafer. In the heat treatment apparatuses disclosed in U.S. Pat. No. 4,698,486 and US 2003/0183612, a semiconductor wafer is preheated to a certain degree of temperature by, for example, halogen lamps and then heated to a desired processing temperature by pulse heating using flash lamps.

Preheating using the halogen lamps, as disclosed in U.S. Pat. No. 4,698,486 and US 2003/0183612, has a processing advantage that the semiconductor wafer will be preheated to a relatively high preheating temperature in a short time, but at the same time, it may more likely cause a problem that the peripheral portion of the semiconductor wafer will have a lower temperature than the central portion. Conceivable causes of this uneven temperature distribution include heat radiation from the peripheral portion of the semiconductor wafer, and heat conduction into a relatively low-temperature quartz susceptor from the peripheral portion of the semiconductor wafer. In order to address this problem, Japanese Patent Application Laid-Open No 2012-174879 proposes to install a cylindrical louver made of a semitransparent material between halogen lamps and a semiconductor wafer in order to make uniform the in-plane temperature distribution of the semiconductor wafer during preheating.

The presence of the louver, as proposed in Japanese Patent Application Laid-Open No. 2012-174879, ameliorates the problem of a temperature drop in the peripheral portion of the semiconductor wafer, but a new problem arises in that the presence of the louver conversely increases the temperature in a region of a semiconductor wafer that is slightly inward of the peripheral portion of the semiconductor wafer.

SUMMARY OF THE INVENTION

The present invention is directed to a heat treatment apparatus for heating a disk-shaped substrate by irradiating the substrate with light.

According to an aspect of the present invention, the heat treatment apparatus includes a chamber that houses a substrate, a holder that holds the substrate in the chamber, a light irradiation part in which a plurality of rod-shaped lamps are arranged in a light source region that is larger than a major surface of the substrate held by the holder and that faces the major surface, a cylindrical louver that is provided between the light irradiation part and the holder, with a central axis of the louver passing through a center of the substrate, and that is impervious to light emitted from the light irradiation part, and a light-shielding member that is provided between the light irradiation part and the holder and that is impervious to the light emitted from the light irradiation part. The light-shielding member has a cut-out portion that allows light to reach a region of the substrate that is shielded from the light emitted from the light irradiation part by the louver.

This configuration allows light to reach and heat this region in the same manner as the other regions and therefore will help make uniform the in-plane temperature distribution of the substrate.

According to another aspect of the present invention, the heat treatment apparatus includes a chamber that houses a substrate, a holder that holds the substrate within the chamber, a light irradiation part in which a plurality of rod-shaped lamps are arranged in a light source region that is larger than a major surface of the substrate held by the holder and that faces the major surface, a cylindrical louver that is provided between the light irradiation part and the holder, with a central axis of the louver passing through a center of the substrate, and that is impervious to light emitted from the light irradiation part, and a light-shielding member that is provided between the light irradiation part and the holder and that is impervious to the light emitted from the light irradiation part. Part of the light-shielding member is made of a transparent member to allows light to reach a region of the substrate that is shielded from the light emitted from the light irradiation part by the louver.

This configuration allows light to reach and heat this region in the same manner as the other regions and therefore will help make uniform the in-plane temperature distribution of the substrate.

Thus, an object of the present invention is to make uniform the in-plane temperature distribution of a substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a perspective view of the overall external appearance of a cylindrical louver including a perfect ring-shaped light-shielding member;

FIG. 11 illustrates how light is shielded by the structure in FIG. 10;

FIG. 15 is a plan view of a light-shielding member according to a fourth preferred embodiment; and FIG. 16 illustrates the in-plane temperature distribution of the semiconductor wafer in the presence of only a louver.

DESCRIPTION OF THE PREFERRED EMBODIMENTS

Hereinafter, preferred embodiments of the present invention will be described in detail with reference to the drawings.

First Preferred Embodiment

Figure 1:
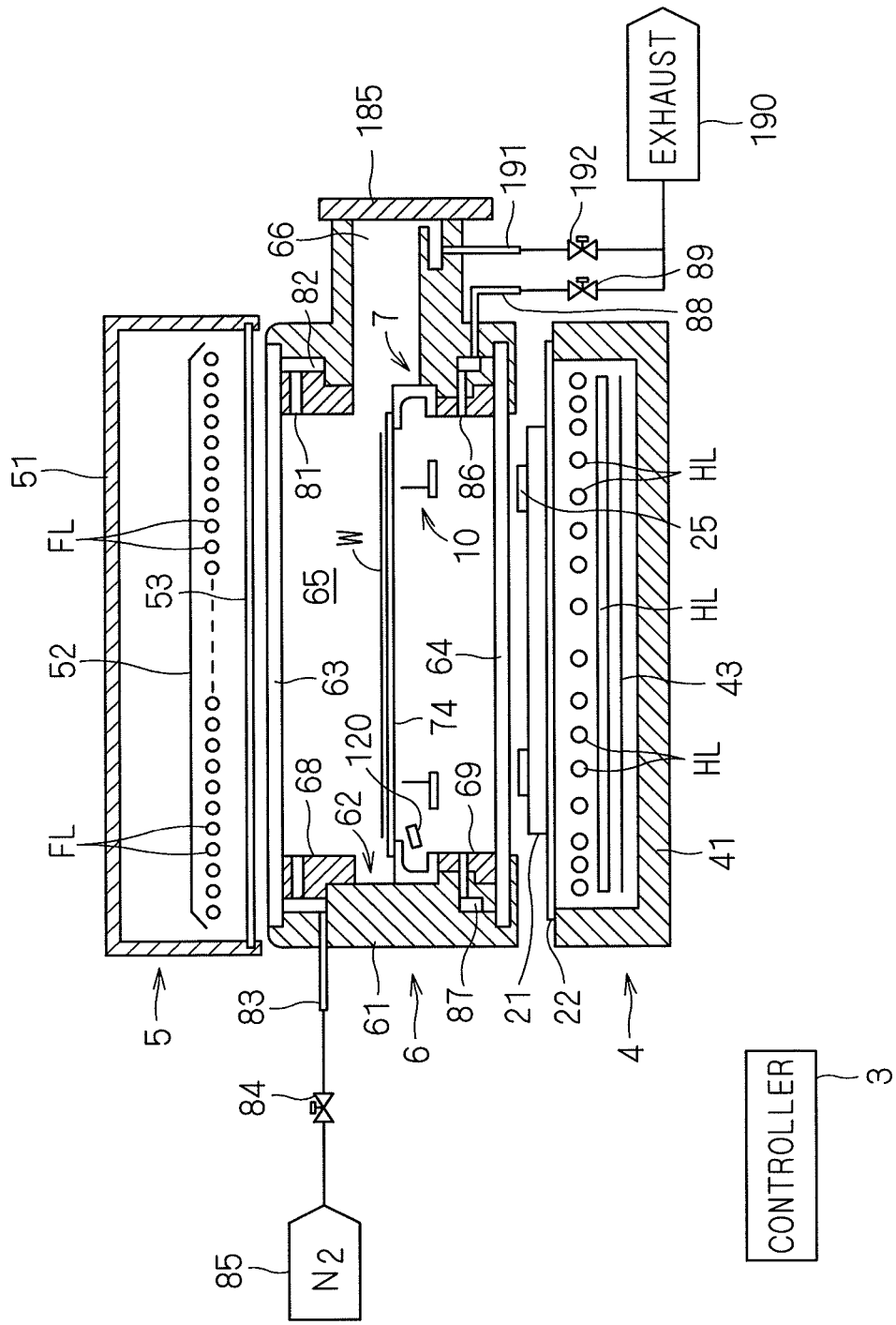
FIG. 1 is a longitudinal cross-sectional view of a heat treatment apparatus according to the present invention.

FIG. 1 is a longitudinal cross-sectional view of a configuration of a heat treatment apparatus 1 according to the present invention. The heat treatment apparatus 1 of the present preferred embodiment is a flash-lamp annealing apparatus for heating a disk-shaped semiconductor wafer W, which is a substrate, by irradiating the semiconductor wafer W with flash light. The size of the semiconductor wafer W to be processed is not particularly limited and may have a diameter of, for example, ϕ300 mm or ϕ450 mm (in the present preferred embodiment, ϕ300 mm). The semiconductor wafer W is doped with impurities before being conveyed into the heat treatment apparatus 1, and the doped impurities are activated by heat treatment performed by the heat treatment apparatus 1. For easy understanding of drawings, the dimensions of each constituent element and the number of constituent elements in FIG. 1 and subsequent drawings may be exaggerated or simplified as necessary.

The heat treatment apparatus 1 includes a chamber 6 that houses the semiconductor wafer W, a flash heater 5 that includes multiple built-in flash lamps FL, and a halogen heater 4 that includes multiple built-in halogen lamps HL. The flash heater 5 is located above the chamber 6, and the halogen heater 4 is located below the chamber 6. A louver 21 and a light-shielding member 25 are provided between the halogen heater 4 and the chamber 6. The heat treatment apparatus 1 further includes, within the chamber 6, a holder 7 that holds the semiconductor wafer W in a horizontal position and a transfer mechanism 10 for transferring the semiconductor wafer W between the holder 7 and the outside of the heat treatment apparatus 1. The heat treatment apparatus 1 further includes a controller 3 that controls operating mechanisms provided in the halogen heater 4, the flash heater 5, and the chamber 6 to perform the heat treatment of the semiconductor wafer W.

The chamber 6 is configured by mounting quartz chamber windows on the top and bottom of a tubular chamber side portion 61. The chamber side portion 61 has a roughly tubular shape that is open at the top and the bottom, the opening at the top being equipped with and closed by an upper chamber window 63 and the opening at the bottom being equipped with and closed by a lower chamber window 64. The upper chamber window 63, which forms the ceiling of the chamber 6, is a disk-shaped member made of quartz and functions as a quartz window that allows the flash light emitted from the flash heater 5 to pass through it into the chamber 6. The lower chamber window 64, which forms the floor of the chamber 6, is also a disk-shaped member made of quartz and functions as a quartz window that allows the light emitted from the halogen heater 4 to pass through it into the chamber 6.

A reflection ring 68 is mounted on the upper part of the inner wall surface of the chamber side portion 61, and a reflection ring 69 is mounted on the lower part thereof. Both of the reflection rings 68 and 69 have a ring shape. The upper reflection ring 68 is mounted by being fitted from above the chamber side portion 61. The lower reflection ring 69 is mounted by being fitted from below the chamber side portion 61 and fastened with screws (not shown). That is, the reflection rings 68 and 69 are both removably mounted on the chamber side portion 61. The chamber 6 has an inner space that is surrounded by the upper chamber window 63, the lower chamber window 64, the chamber side portion 61, and the reflection rings 68 and 69 and defined as a heat treatment space 65.

The presence of the reflection rings 68 and 69 on the chamber side portion 61 generates a recessed portion 62 in the inner wall surface of the chamber 6. That is, the recessed portion 62 is surrounded by a central portion of the inner wall surface of the chamber side portion 61 on which the reflection rings 68 and 69 are not mounted, the lower end surface of the reflection ring 68, and the upper end surface of the reflection ring 69. The recessed portion 62 has a ring shape extending in a horizontal direction along the inner wall surface of the chamber 6, and surrounds the holder 7 that holds the semiconductor wafer W.

The chamber side portion 61 and the reflection rings 68 and 69 are each made of a metal material (e.g., stainless steel) having excellent strength and heat resistance. The inner circumferential surfaces of the reflection rings 68 and 69 are mirror-finished by electrolytic nickel plating.

The chamber side portion 61 has a transport opening (throat) 66 through which the semiconductor wafer W is transported into and out of the chamber 6. The transport opening 66 is openable and closable by a gate valve 185. The transport opening 66 is communicatively connected to the outer circumferential surface of the recessed portion 62. Thus, when the gate valve 185 opens the transport opening 66, the semiconductor wafer W can be transported into and out of the heat treatment space 65 from the transport opening 66 through the recessed portion 62. When the gate valve 185 closes the transport opening 66, the heat treatment space 65 in the chamber 6 becomes an enclosed space.

The upper part of the inner wall of the chamber 6 has a gas supply port 81 through which a process gas (in the present preferred embodiment, nitrogen gas ($N_2$)) is supplied to the heat treatment space 65. The gas supply port 81 is located at a position above the recessed portion 62 and may be provided in the reflection ring 68. The gas supply port 81 is communicatively connected to a gas supply pipe 83 through a buffer space 82 that is formed in a ring shape inside the side wall of the chamber 6. The gas supply pipe 83 is connected to a nitrogen gas supply source 85. A valve 84 is interposed in the path of the gas supply pipe 83. When the valve 84 is open, a nitrogen gas is supplied from the gas supply source 85 to the buffer space 82. The nitrogen gas flowing into the buffer space 82 flows throughout the buffer space 82, which has lower fluid resistance than the gas supply port 81, and is supplied from the gas supply port 81 into the heat treatment space 65. Note that the process gas is not limited to a nitrogen gas, and may be an inert gas such as argon (Ar) or helium (He), or a reactive gas such as oxygen ($O_2$), hydrogen ($H_2$), chlorine ($Cl_2$), hydrogen chloride (HCl), ozone ($O_3$), or ammonia ($NH_3$).

On the other hand, the lower part of the inner wall of the chamber 6 has a gas exhaust port 86 from which the gas in the heat treatment space 65 is exhausted. The gas exhaust port 86 is located at a position below the recessed portion 62 and may be provided in the reflection ring 69. The gas exhaust port 86 is communicatively connected to a gas exhaust pipe 88 through a buffer space 87 that is formed in a ring shape inside the side wall of the chamber 6. The gas exhaust pipe 88 is connected to an exhaust part 190. A valve 89 is interposed in the path of the gas exhaust pipe 88. When the valve 89 is open, the gas in the heat treatment space 65 is exhausted from the gas exhaust port 86 through the buffer space 87 to the gas exhaust pipe 88. Alternatively, multiple gas supply ports 81 and multiple gas exhaust ports 86 may be provided in the direction along the circumference of the chamber 6, or the gas supply port 81 and the gas exhaust port 86 may be slit-shaped. The nitrogen gas supply source 85 and the exhaust part 190 may be mechanisms provided in the heat treatment apparatus 1, or may be utilities in a factory where the heat treatment apparatus 1 is installed.

One end of the transport opening 66 is connected to a gas exhaust pipe 191 from which the gas in the heat treatment space 65 is exhausted. The gas exhaust pipe 191 is connected via a valve 192 to the exhaust part 190. When the valve 192 is open, the gas in the chamber 6 is exhausted from the transport opening 66.

Figure 2:
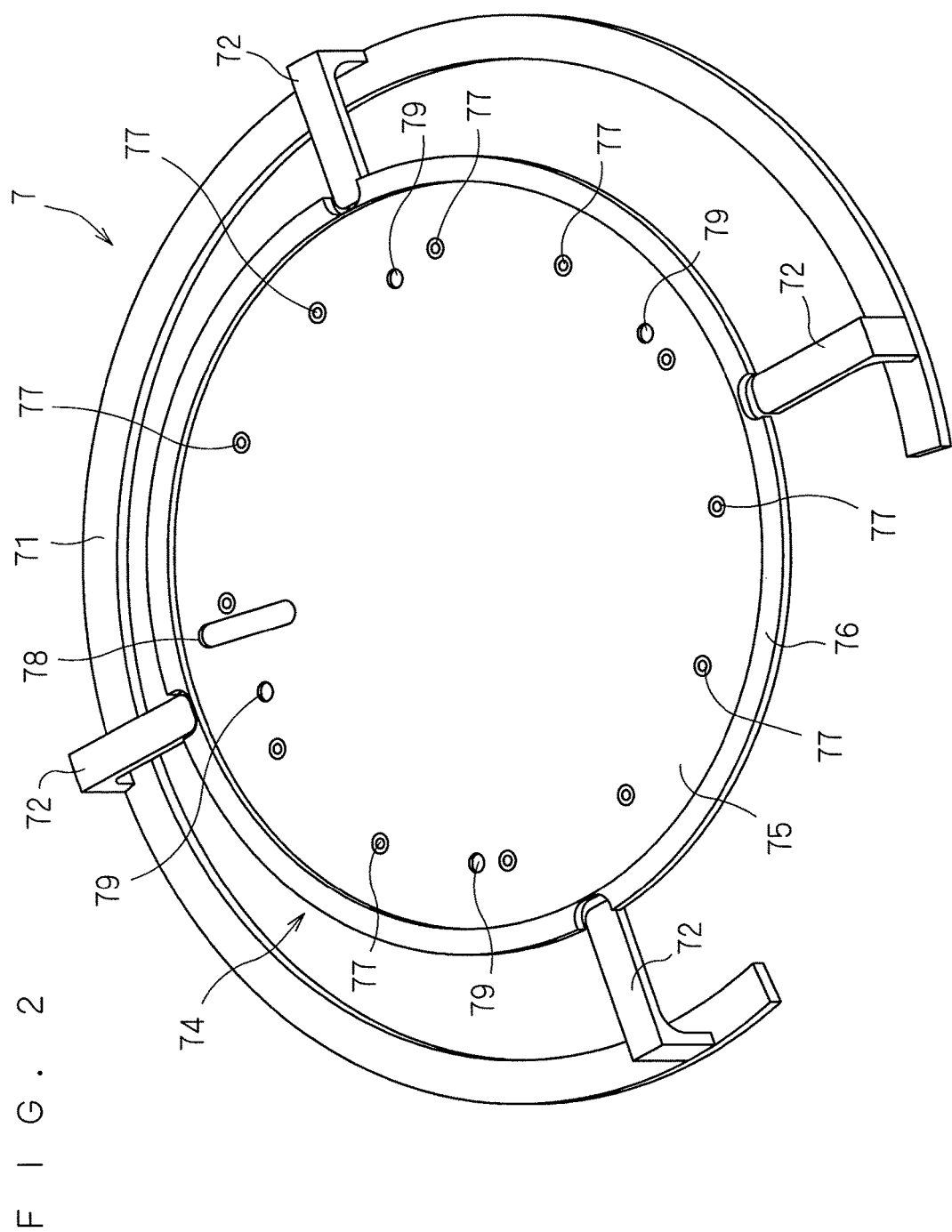
FIG. 2 is a perspective view of the overall external appearance of a holder.

FIG. 2 is a perspective view of the overall external appearance of the holder 7. The holder 7 is constituted by a base ring 71, connecting parts 72, and a susceptor 74. The base ring 71, the connecting parts 72, and the susceptor 74 are all made of quartz. That is, the holder 7 as a whole is made of quartz.

The base ring 71 is a quartz member having an arc shape that is a ring shape having a missing portion. The missing portion is provided in order to avoid interference between the base ring 71 and transfer arms 11 of the transfer mechanism 10, which will be described later. The base ring 71 is placed on the bottom surface of the recessed portion 62 and thereby supported by the wall surface of the chamber 6 (see FIG. 1). The upper surface of the base ring 71 has the multiple (in the present preferred embodiment, four) upright connecting parts 72 arranged along the circumference of the base ring 71. The connecting parts 72 are also quartz members and fixedly attached to the base ring 71 by welding.

Figure 3:
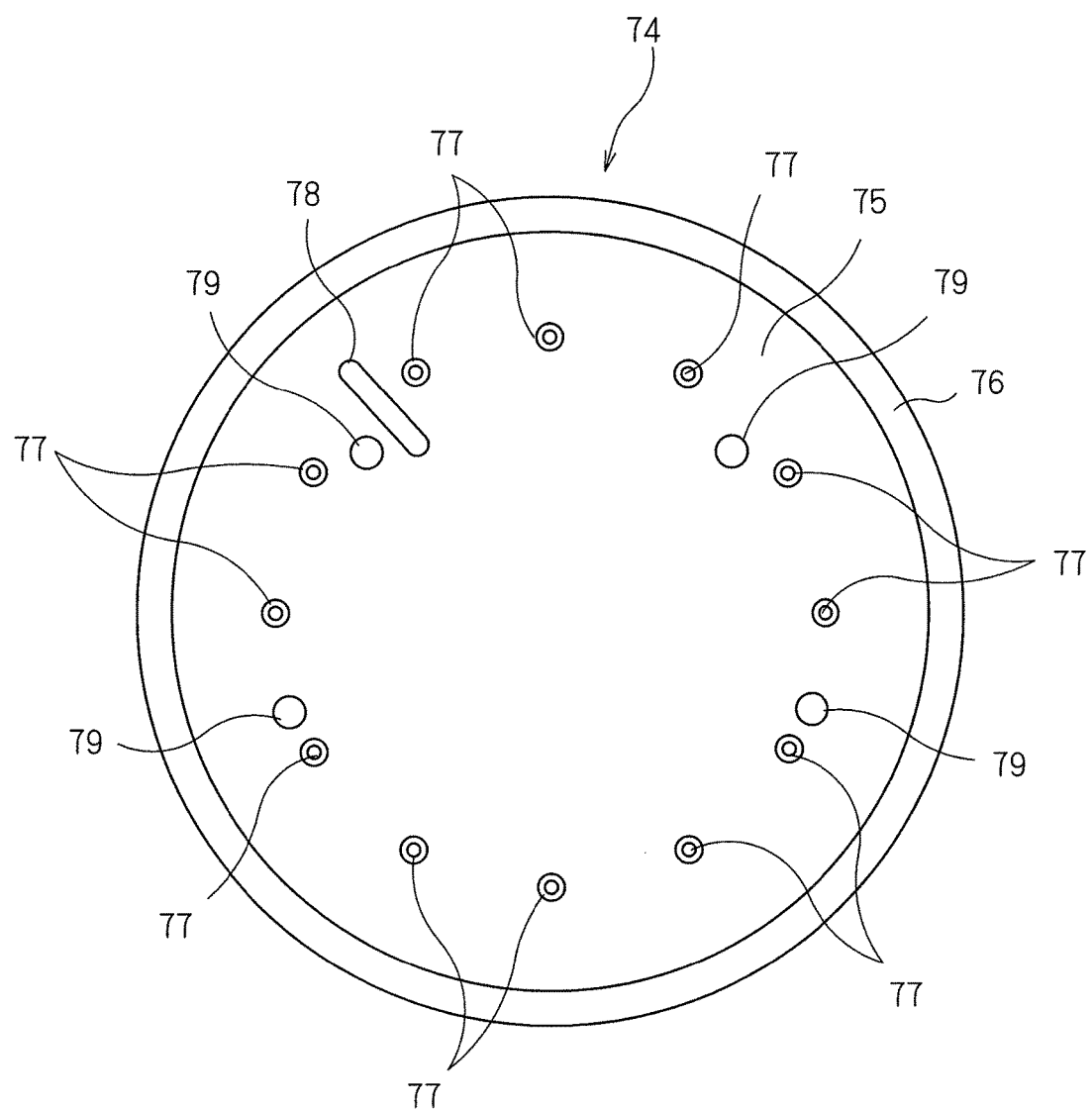
FIG. 3 is a plan view of a susceptor.
Figure 4:
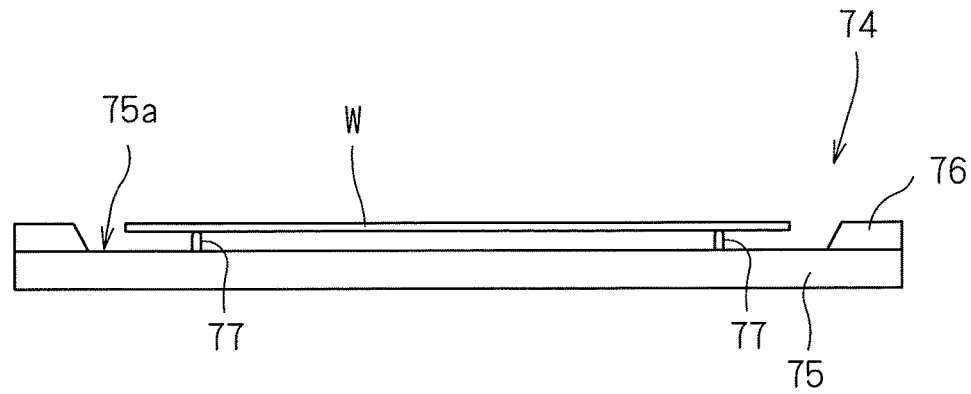
FIG. 4 is a cross-sectional view of the susceptor.

The susceptor 74 is supported by the four connecting parts 72 provided on the base ring 71. FIG. 3 is a plan view of the susceptor 74. FIG. 4 is a cross-sectional view of the susceptor 74. The susceptor 74 includes a holding plate 75, a guide ring 76, and multiple substrate support pins 77. The holding plate 75 is a substantially circular flat plate-like member made of quartz. The diameter of the holding plate 75 is greater diameter than the diameter of the semiconductor wafer W. That is, the holding plate 75 has a greater plane size than the semiconductor wafer W.

The guide ring 76 is provided on the periphery of the upper surface of the holding plate 75. The guide ring 76 is a ring-shaped member having a greater inner diameter than the diameter of the semiconductor wafer W. For example, when the semiconductor wafer W has a diameter of $\phi 300$ mm, the inner diameter of the guide ring 76 is $\phi 320$ mm. The inner periphery of the guide ring 76 is a tapered surface that tapers upward from the holding plate 75. The guide ring 76 is made of quartz similar to that of the holding plate 75. The guide ring 76 may be welded to the upper surface of the holding plate 75, or may be fixed to the holding plate 75 with pins that are processed separately or by other means. Alternatively, the holding plate 75 and the guide ring 76 may be processed as an integral member.

A region of the upper surface of the holding plate 75 that is inward of the guide ring 76 serves as a flat plate-like holding surface 75a on which the semiconductor wafer W is held. The multiple substrate support pins 77 are provided upright on the holding surface 75a of the holding plate 75. In the present preferred embodiment, 12 substrate support pins 77 in total are provided upright at an interval of 30 degrees along the circumference of a circle that is concentric with the outer circumferential circle of the holding surface 75a (or the inner circumferential circle of the guide ring 76). The diameter of the circle along which the 12 substrate support pins 77 are provided (i.e., the distance between opposing substrate support pins 77) is smaller than the diameter of the semiconductor wafer W, and may be in the range of $\phi 270$ mm to $\phi 280$ mm (in the present preferred embodiment, $\phi 280$ mm) when the semiconductor wafer W has a diameter of $\phi 300$ mm. Each substrate support pin 77 is made of quartz. The multiple substrate support pins 77 may be provided by welding on the upper surface of the holding plate 75, or may be processed integrally with the holding plate 75.

Referring back to FIG. 2, the four connecting parts 72 provided upright on the base ring 71 and the peripheral portion of the holding plate 75 of the susceptor 74 are fixedly attached to each other by welding. That is, the susceptor 74 and the base ring 71 are fixedly coupled to each other by the connecting parts 72. The base ring 71 of the holder 7 is supported by the wall surface of the chamber 6, and thereby the holder 7 is mounted on the chamber 6. With the holder 7 mounted on the chamber 6, the holding plate 75 of the susceptor 74 is held in a horizontal position (position at which the normal coincides with the vertical direction). That is, the holding surface 75a of the holding plate 75 becomes horizontal.

The semiconductor wafer W transported into the chamber 6 is placed and held in a horizontal position on the susceptor 74 of the holder 7 mounted on the chamber 6. At this time, the semiconductor wafer W is supported by the 12 substrate support pins 77 provided upright on the holding plate 75 and is held by the susceptor 74. To be exact, the upper ends of the 12 substrate support pins 77 come in contact with the lower surface of the semiconductor wafer W and support the semiconductor wafer W. Since the 12 substrate support pins 77 have the same height (the same distance from the upper ends of the substrate support pins 77 to the holding surface 75a of the holding plate 75), they can support the semiconductor wafer W in a horizontal position.

The semiconductor wafer W is supported by the multiple substrate support pins 77, with a predetermined spacing from the holding surface 75a of the holding plate 75. The guide ring 76 has a thickness greater than the height of the substrate support pins 77. Thus, the presence of the guide ring 76 prevents the semiconductor wafer W supported by the multiple substrate support pins 77 from being misaligned in the horizontal direction.

As illustrated in FIGS. 2 and 3, the holding plate 75 of the susceptor 74 has a vertically penetrating opening 78. The opening 78 is provided to allow a radiation thermometer 120 (see FIG. 1) to receive radiation light (infrared light) radiated from the underside of the semiconductor wafer W held by the susceptor 74. That is, the radiation thermometer 120 receives the light radiated from the underside of the semiconductor wafer W held by the susceptor 74 through the opening 78, and the temperature of the semiconductor wafer W is measured with a separate-type detector. The holding plate 75 of the susceptor 74 further has four through holes 79 that allow lift pins 12 of the transfer mechanism 10, which will be described later, to pass through them for transfer of the semiconductor wafer W.

Figure 5:
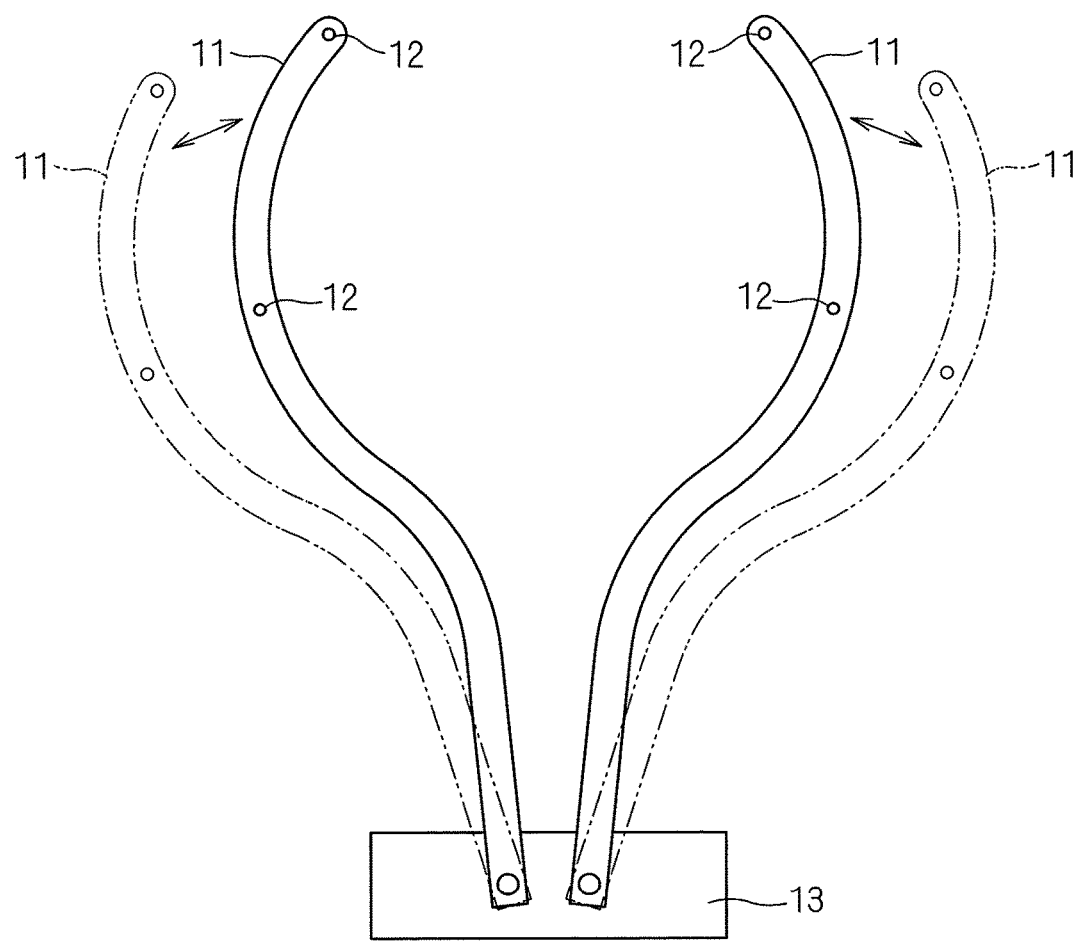
FIG. 5 is a plan view of a transfer mechanism.
Figure 6:
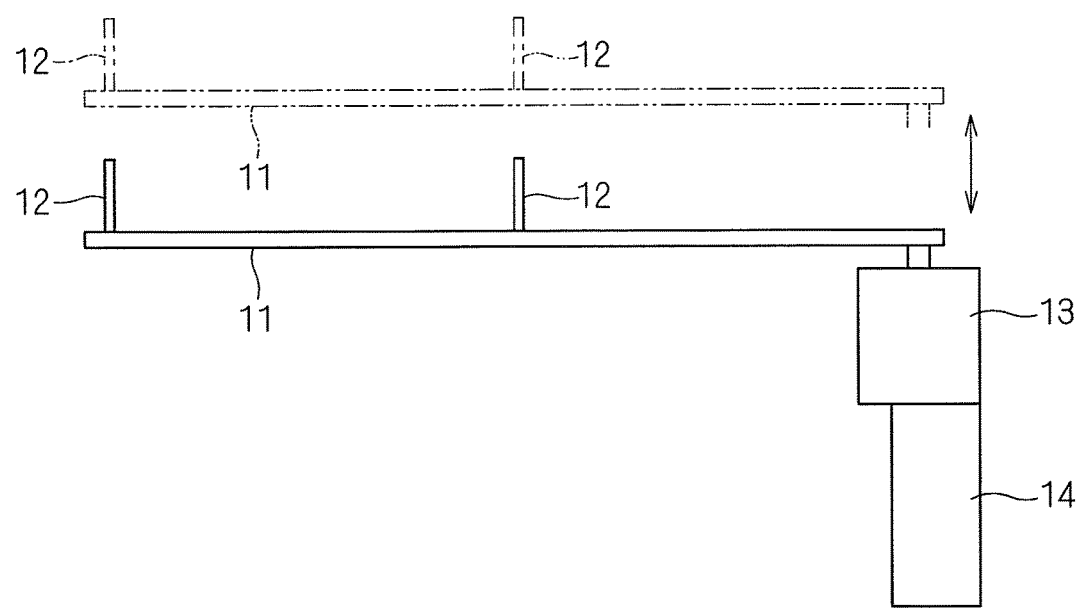
FIG. 6 is a side view of the transfer mechanism.

FIG. 5 is a plan view of the transfer mechanism 10. FIG. 6 is a side view of the transfer mechanism 10. The transfer mechanism 10 includes two transfer arms 11. The transfer arms 11 have an arc shape that extends along the substantially ring-shaped recessed portion 62. Each transfer arm 11 has two upright lift pins 12 and is pivotable by a horizontal movement mechanism 13. The horizontal movement mechanism 13 horizontally moves the pair of transfer arms 11 between a transfer operation position (position indicated by the solid line in FIG. 5) at which the semiconductor wafer W is transferred to the holder 7 and a retracted position (position indicated by the dashed double-dotted line in FIG. 5) at which the transfer arms 11 do not overlap with the semiconductor wafer W held by the holder 7 in a plan view. The horizontal movement mechanism 13 may be a mechanism for pivoting each transfer arm 11 separately by an individual motor, or may be a mechanism for using a link mechanism to pivot the pair of transfer arms 11 in conjunction with each other by a single motor.

The pair of transfer arms 11 are also movable up and down along with the horizontal movement mechanism 13 by an elevating mechanism 14. When the elevating mechanism 14 moves the pair of transfer arms 11 upward at the transfer operation position, the four lift pins 12 in total pass through the through holes 79 (see FIGS. 2 and 3) of the susceptor 74 so that the upper ends of the lift pins 12 protrude from the upper surface of the susceptor 74. On the other hand, when the elevating mechanism 14 moves the pair of transfer arms 11 downward at the transfer operation position to pull the lift pins 12 out of the through holes 79 and the horizontal movement mechanism 13 moves the pair of transfer arms 11 so as to open the transfer arms 11, each transfer arm 11 moves to its retracted position. The retracted positions of the pair of transfer arms 11 are directly above the base ring 71 of the holder 7. Since the base ring 71 is placed on the bottom surface of the recessed portion 62, the retracted positions of the transfer arms 11 are inside the recessed portion 62. Note that an exhaust mechanism (not shown) is also provided in the vicinity of an area where the driving part (the horizontal movement mechanism 13 and the elevating mechanism 14) of the transfer mechanism 10 is provided, in order to allow the atmosphere around the driving part of the transfer mechanism 10 to be exhausted to the outside of the chamber 6.

Referring back to FIG. 1, the flash heater 5 provided above the chamber 6 includes, within a casing 51, a light source that includes multiple (in the present preferred embodiment, 30) xenon flash lamps FL, and a reflector 52 that is provided to cover the top of the light source. The casing 51 of the flash heater 5 also has a lamp-light radiating window 53 mounted on the bottom. The lamp-light radiating window 53, which forms the floor of the flash heater 5, is a plate-like quartz window made of quartz. Since the flash heater 5 is located above the chamber 6, the lamp-light radiating window 53 faces the upper chamber window 63. The flash lamps FL emit flash light from above the chamber 6 to the heat treatment space 65 through the lamp light irradiation window 53 and the upper chamber window 63.

The multiple flash lamps FL are rod-shaped lamps, each having an elongated cylindrical shape, and are arrayed in a plane such that their longitudinal directions are parallel to one another along the major surface of the semiconductor wafer W held by the holder 7 (i.e., in the horizontal direction). Thus, a plane formed by the array of the flash lamps FL is also a horizontal plane.

The xenon flash lamps FL each include a rod-shaped glass tube (discharge tube) and a trigger electrode provided on the outer circumferential surface of the glass tube, the glass tube containing a xenon gas sealed therein and including an anode and a cathode that are disposed at opposite ends of the glass tube and connected to a capacitor. Since the xenon gas serves electrically as an insulator, no electricity will flow within the glass tube under normal conditions even if the capacitor stores electric charge. However, if an electrical breakdown has occurred due to the application of a high voltage to the trigger electrode, the electricity stored in the capacitor will instantaneously flow within the glass tube, and light will be emitted by the excitation of xenon atoms or molecules at that time. These xenon flash lamps FL have the properties of being able to apply extremely intense light, as compared with light sources for continuous lighting such as the halogen lamps HL, because the electrostatic energy stored in advance in the capacitor is converted into an extremely short optical pulse of 0.1 to 100 milliseconds. That is, the flash lamps FL are pulsed light-emitting lamps that emit light instantaneously for an extremely short time (e.g., less than one second). Note that the light emission time of the flash lamps FL may be adjusted by using the coil constant of a lamp source that supplies power to the flash lamps FL.

The reflector 52 is provided above the multiple flash lamps FL to cover the whole of the flash lamps FL. The reflector 52 has a basic function of reflecting the flash light emitted from the multiple flash lamps FL toward the heat treatment space 65. The reflector 52 is made of an aluminum alloy plate, and the surface (surface facing the flash lamps FL) of the reflector 52 is roughened by blasting.

The halogen heater 4 located below the chamber 6 includes the multiple (in the present preferred embodiment, 40) build-in halogen lamps HL within a casing 41. The halogen heater 4 is a light irradiation part that causes the multiple halogen lamps HL to emit light from the underside of the chamber 6 to the heat treatment space 65 through the lower chamber window 64 and to heat the semiconductor wafer W.

Figure 7:
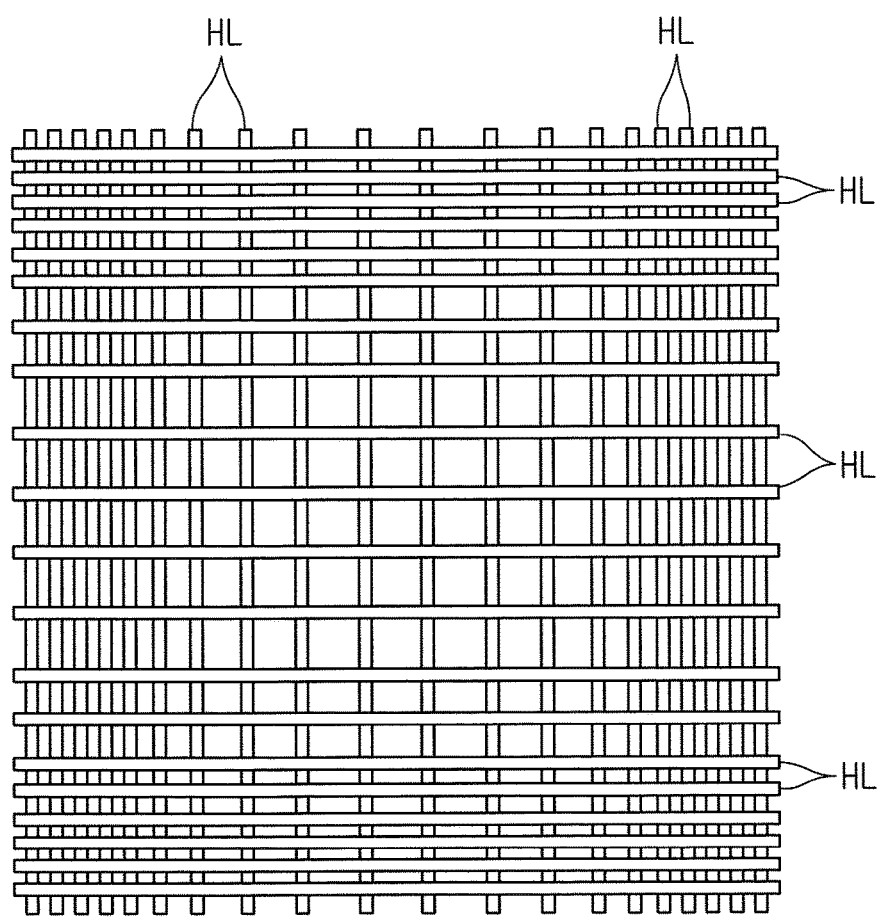
FIG. 7 is a plan view illustrating the arrangement of multiple halogen lamps.

FIG. 7 is a plan view illustrating the arrangement of the multiple halogen lamps HL. In the first preferred embodiment, the multiple halogen lamps HL are arranged in a region that is larger than the main surface of the disk-shaped semiconductor wafer W held by the holder 7 (i.e., 300-mm diameter circle). The multiple halogen lamps HL are also arranged in a light source region that faces the lower main surface of the semiconductor wafer W.

As illustrated in FIGS. 1 and 7, the 40 halogen lamps HL are divided into and arranged in upper and lower rows in the first preferred embodiment. The upper row, which is closer to the holder 7, includes an array of 20 halogen lamps HL, and the lower row, which is further to the holder 7 than the upper row, includes an array of 20 halogen lamps HL. Each halogen lamp HL is a rod-shaped lamp having an elongated cylindrical shape. The 20 halogen lamps HL in each of the upper and lower rows are arranged such that their longitudinal directions are parallel to one another along the major surface of the semiconductor wafer W held by the holder 7 (i.e., in the horizontal direction). Thus, a plane formed by the array of the halogen lamps HL in the upper row and a plane formed by the array of the halogen lamps HL in the lower row are both horizontal planes.

As illustrated in FIG. 7, a lamp group of the upper row of halogen lamps HL and a lamp group of the lower row of halogen lamps HL are arranged so as to intersect each other in a grid-like pattern. That is, the 40 halogen lamps HL in total are arranged such that the direction along the lengths of the upper row of 20 halogen lamps HL and the direction along the lengths of the lower row of 20 halogen lamps HL are orthogonal to each other.

The halogen lamps HL are filament-type light sources that make the filament disposed in the glass tube incandescent and emit light by applying current to the filament. The glass tube contains a gas that is produced by introducing a trace amount of halogen elements (e.g., iodine or bromine) into an inert gas such as nitrogen or argon. The introduction of halogen elements will help set the temperature of the filament to a high value while suppressing breakage of the filament. Thus, the halogen lamps HL have the properties of having a longer life than typical incandescent lamps and being able to apply intense light continuously. That is, the halogen lamps HL are continuous lighting lamps that continuously emit light for at least one second. The halogen lamps HL are also long-life because of their rod-like shape, and when arranged in the horizontal direction, exhibits excellent efficiency in the radiation of the semiconductor wafer W located above the halogen lamps.

As illustrated in FIG. 7, in both of the upper and lower rows, the density of arrangement of the halogen lamps HL in a region that faces the peripheral portion of the semiconductor wafer W held by the holder 7 is higher than that in a region that faces the central portion of the semiconductor wafer W. That is, in both of the upper and lower rows, the halogen lamps HL in the peripheral portion of the light source region are arranged at a shorter pitch than the halogen lamps HL in the central portion. This increases the illuminance of light from the peripheral portion of the light source region rather than the illuminance of light from the central portion, and thereby increases the amount of light applied to the peripheral portion of the semiconductor wafer W where a temperature drop is likely to occur, during heating using the light applied from the halogen heater 4.

The halogen heater 4 also includes, within the casing 41, a reflector 43 that is located under the two rows of halogen lamps HL (FIG. 1). The reflector 43 reflects the light emitted from the multiple halogen lamps HL toward the heat treatment space 65.

Figure 8:
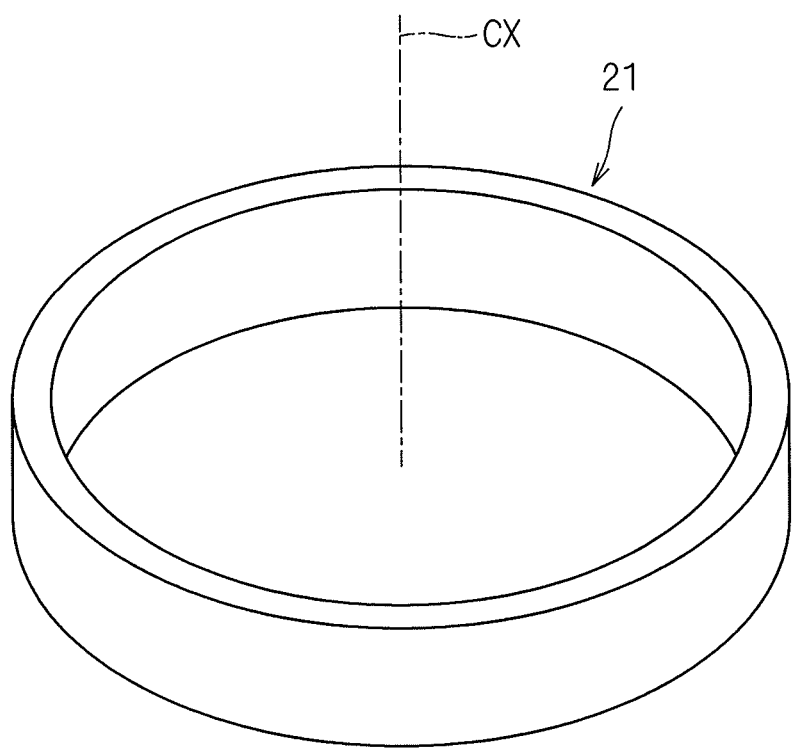
FIG. 8 is a perspective view of a louver.

The louver 21 and the light-shielding member 25 are provided between the halogen heater 4 and the holder 7. FIG. 8 is a perspective view of the louver 21. The louver 21 is a cylindrical (bottomless cylindrical) member with upper and lower opening ends. The louver 21 is made of a material that is impervious to the light emitted from the halogen lamps HL of the halogen heater 4, and for example, made of opaque quartz with a large number of superfine air bubbles contained in silica glass. The size of the louver 21 may be appropriately changed in accordance with the configurations and arrangement of the chamber 6 and the halogen heater 4. It is sufficient that the outer diameter of the cylinder of the louver 21 be smaller than the area of the light source region in which the halogen lamps HL are located. In the first preferred embodiment, the louver 21 has an outer diameter of, for example, 300 mm, which is the same as the diameter of the semiconductor wafer W, and an inner diameter of, for example, 294 mm. The height of the louver 21 may be in the range of, for example, 15 to 25 mm (in the first preferred embodiment, 16 mm).

As illustrated in FIG. 1, a louver stage 22 is provided on the top of the casing 41 of the halogen heater 4. The louver stage 22 is a flat plate-like member made of silica glass that is transparent to the light emitted from the halogen lamps HL. The louver 21 is disposed on the upper surface of the louver stage 22. The louver 21 is installed such that its cylinder has a central axis CX that passes through the center of the semiconductor wafer W held by the holder 7. The multiple halogen lamps HL of the halogen heater 4 are arranged in the region that faces the lower surface of the semiconductor wafer W held by the holder 7. Thus, the central axis CX of the louver 21 also passes through the center of the array of the halogen lamps HL.

When the cylindrical louver 21 made of opaque quartz is located between the halogen heater 4 and the chamber 6 in this way, light that travels from halogen lamps HL that are located outward of the louver 21 toward an inner region of the semiconductor wafer W (i.e., region that is inward of the peripheral portion), which includes the vicinity of the central portion, will be blocked off by the wall surface of the opaque louver 21 during light emission from the multiple halogen lamps HL. On the other hand, light that travels from the halogen lamps HL located outward of the louver 21 toward the peripheral portion of the semiconductor wafer W will not be blocked. As a result, the presence of the louver 21 will help reduce the amount of light travelling toward the inner region while almost not reducing the amount of light travelling from the halogen heater 4 toward the peripheral portion of the semiconductor wafer W. That is, the heating of the inner region is weakened, and the peripheral portion of the semiconductor wafer W where a temperature drop is likely to occur is heated relatively strongly.

However, it is found that the installation of only the louver 21 above the halogen heater 4 will raise a new problem in that the temperature of a region that is slightly inward of the peripheral portion of the semiconductor wafer W is increased on the contrary during light irradiation heating using the halogen lamps HL. FIG. 16 illustrates the in-plane temperature distribution of the semiconductor wafer W in the presence of only the louver 21. The radiation of light from the halogen lamps HL in the presence of only the louver 21 may generate overheated regions (hot spots) 99 that have a higher temperature than the other regions, in areas that are slightly inward of the peripheral portion of the semiconductor wafer W, as illustrated in FIG. 16. For example, in the case of the semiconductor wafer W having a diameter of 300 mm, overheated regions 99 may appear around within a radius of about 117 mm in the surface of the semiconductor wafer W. That is, the overheated regions 99 may have an arc shape having a diameter of about 235 mm.

Figure 9:
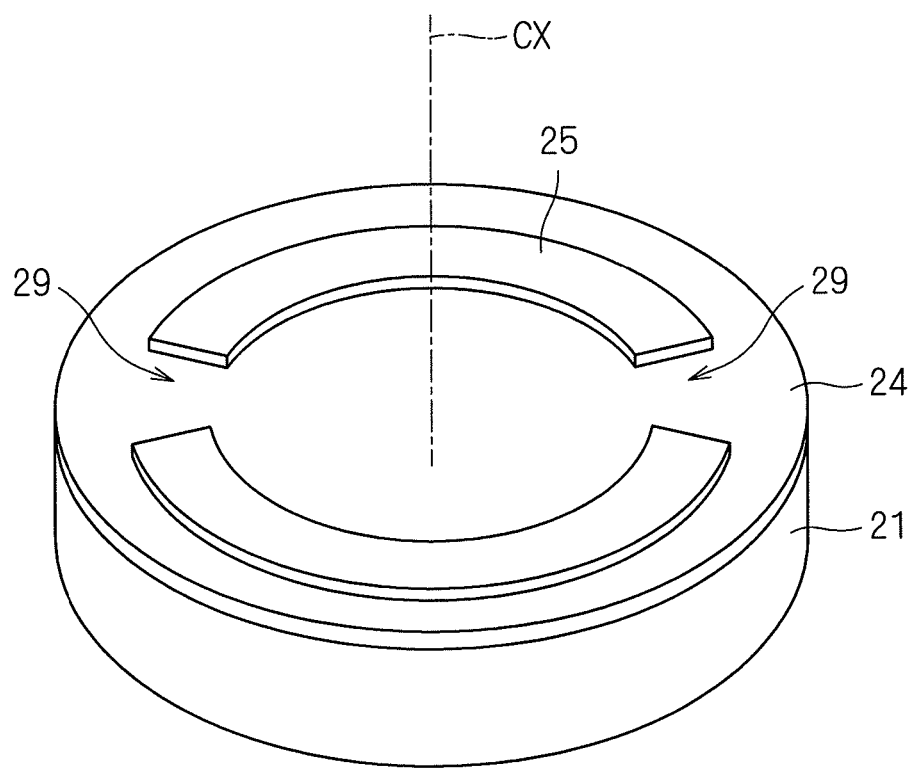
FIG. 9 is a perspective view of the overall external appearance of the louver and a light-shielding member according to a first preferred embodiment.

In view of this, the present invention provides the light-shielding member 25, in addition to the louver 21, between the halogen heater 4 and the holder 7 in order to avoid the generation of such arc-shaped overheated regions 99. FIG. 9 is a perspective view illustrating the overall external appearance of the louver 21 and the light-shielding member 25 according to the first preferred embodiment. A ring stage 24 is installed on the top of the cylindrical louver 21. The ring stage 24 is a disk-shaped member made of silica glass that is transparent to the light emitted from the halogen lamps HL. The ring stage 24 has a diameter that is the same as the outer diameter of the louver 21 (in the present embodiment, 300 mm). The ring stage 24 has a plate thickness of 2 to 3 mm.

The light-shielding member 25 is disposed on the upper surface of the ring stage 24. That is, the light-shielding member 25 is further disposed on the ring stage 24, which is a quartz plate provided on the louver 21. The light-shielding member 25 has a shape of a ring-shaped flat light-shielding ring having missing portions. More specifically, the light-shielding member 25 has a shape of a ring-shaped light-shielding ring having two cut-out portions 29 at radially opposite positions. The outer diameter of the ring portion of the light-shielding member 25 is smaller than the inner diameter of the cylindrical louver 21, and may be 280 mm. Thus, the outer size of the light-shielding member 25 is smaller than the inner size of the louver 21. The inner diameter of the ring portion of the light-shielding member 25 is, for example, 260 mm, and the plate thickness of the light-shielding member 25 is, for example, 2 mm.

The light-shielding member 25 is made of a material that is impervious to the light emitted from the halogen lamps HL of the halogen heater 4, and may be made of opaque quartz with a large number of superfine air bubbles contained in silica glass. That is, the louver 21 and the light-shielding member 25 are made of the same material.

The central axis CX of the louver 21 coincides with the central axis of the ring portion of the light-shielding member 25. Thus, the light-shielding member 25 is also installed such that its ring portion has a central axis that passes through the center of the semiconductor wafer W held by the holder 7.

Referring back to FIG. 1, the controller 3 controls the above-described various operating mechanisms of the heat treatment apparatus 1. The controller 3 has a similar hardware configuration to that of a typical computer. That is, the controller 3 includes a CPU that is a circuit for performing various types of computations, a ROM that is a read-only memory for storing basic programs, a RAM that is a readable/writable memory for storing various types of information, and a magnetic disk for storing control software and control data. The processing of the heat treatment apparatus 1 is implemented by the CPU of the controller 3 executing predetermined processing programs.

The heat treatment apparatus 1 also includes, in addition to the above-described configuration, various cooling structures in order to prevent an excessive temperature increase in the halogen heater 4, the flash heater 5, and the chamber 6 due to heat energy generated by the halogen lamps HL and the flash lamps FL during the heat treatment of the semiconductor wafer W. For example, the chamber 6 may have a water-cooled tube (not shown) in the wall. The halogen heater 4 and the flash heater 5 may have an air cooling structure for exhausting heat by forming an internal flow of gas. Moreover, air may be supplied to the spacing between the upper chamber window 63 and the lamp-light irradiation window 53 to cool the flash heater 5 and the upper chamber window 63.

Next is a description of the procedure of processing performed on the semiconductor wafer W by the heat treatment apparatus 1. The semiconductor wafer W to be processed here is a semiconductor substrate that is doped with impurities (ions) by ion implantation. These impurities are activated by flash light irradiation and heat treatment (annealing) performed by the heat treatment apparatus 1. The following procedure of processing performed by the heat treatment apparatus 1 is implemented by the controller 3 controlling the operating mechanisms of the heat treatment apparatus 1.

First, the valve 84 for supplying a gas and the valves 89 and 192 for exhausting a gas are opened to start the supply and exhaust of gases into and from the chamber 6. When the valve 84 is open, a nitrogen gas is supplied from the gas supply port 81 to the heat treatment space 65. When the valve 89 is open, the gas in the chamber 6 is exhausted from the gas exhaust port 86. Thereby, the nitrogen gas supplied from the upper part of the heat treatment space 65 in the chamber 6 flows downward and is exhausted from the lower part of the heat treatment space 65.

When the valve 192 is open, the gas in the chamber 6 is also exhausted from the transport opening 66. Moreover, the atmosphere around the driving part of the transfer mechanism 10 is also exhausted by an exhaust mechanism (not shown). During the heat treatment of the semiconductor wafer W by the heat treatment apparatus 1, the nitrogen gas continues to be supplied to the heat treatment space 65, and the amount of the nitrogen gas supplied is appropriately changed depending on the processing step.

Then, the gate valve 185 is opened to open the transport opening 66, and the ion-implanted semiconductor wafer W is transported into the heat treatment space 65 of the chamber 6 through the transport opening 66 by a transport robot located outside the apparatus. The semiconductor wafer W transported into the heat treatment space 65 by the transport robot is moved to a position directly above the holder 7 and stopped. Then, the pair of transfer arms 11 of the transfer mechanism 10 move horizontally from the retracted positions to the transfer operation positions and upward, so that the lift pins 12 pass through the through holes 79 and protrude from the upper surface of the holding plate 75 of the susceptor 74 to receive the semiconductor wafer W. At this time, the lift pins 12 are elevated to a position above the upper end of the substrate support pins 77.

After the semiconductor wafer W is placed on the lift pins 12, the transport robot is withdrawn from the heat treatment space 65, and the transport opening 66 is closed by the gate valve 185. Then, the pair of transfer arms 11 move downward so that the semiconductor wafer W is transferred from the transfer mechanism 10 to the susceptor 74 of the holder 7 and held in a horizontal position from the underside. The semiconductor wafer W is supported by the multiple substrate support pins 77 provided upright on the holding plate 75 and held by the susceptor 74. The semiconductor wafer W is held by the holder 7 such that its patterned and impurity-doped front surface faces upward. A predetermined spacing is provided between the rear surface (major surface opposite the front surface) of the semiconductor wafer W supported by the multiple substrate support pins 77 and the holding surface 75a of the holding plate 75. The pair of transfer arms 11 that have moved down to a position below the susceptor 74 are retracted to their retracted position, i.e., retracted to the inside of the recessed portion 62, by the horizontal movement mechanism 13.

After the semiconductor wafer W is held in a horizontal position from the underside by the susceptor 74 of the holder 7 made of quartz, all of the 40 halogen lamps HL of the halogen heater 4 are turned on in unison to start preheating (assist-heating). The halogen light emitted from the halogen lamps HL passes through the louver stage 22, the ring stage 24, the lower chamber window 64, and the susceptor 74, which are made of quartz, and is radiated from the rear surface (main surface on the opposite side to the front surface) of the semiconductor wafer W. The semiconductor wafer W that has received the light emitted from the halogen lamps HL is preheated, and thereby the temperature of the semiconductor wafer W rises. Note that the transfer arms 11 of the transfer mechanism 10 that have retracted to the inside of the recessed portion 62 will not impede the heating using the halogen lamps HL.

During the preheating using the halogen lamps HL, the temperature of the semiconductor wafer W is measured with the radiation thermometer 120. That is, the radiation thermometer 120 receives infrared light that is radiated from the rear surface of the semiconductor wafer W held by the susceptor 74 through the opening 78, and measures the increasing wafer temperature. The measured temperature of the semiconductor wafer W is transmitted to the controller 3. The controller 3 controls the output of the halogen lamps HL while monitoring whether the temperature of the semiconductor wafer W, which is rising by the radiation of light from the halogen lamps HL, has reached a predetermined preheating temperature T1. That is, the controller 3 performs feedback control of the output of the halogen lamps HL on the basis of the measured value obtained by the radiation thermometer 120, so that the temperature of the semiconductor wafer W will reach the preheating temperature T1. The preheating temperature T1 is set to a range of about 200° C. to 800° C. at which the impurities doped in the semiconductor wafer W will not be diffused by heat, and preferably, a range of about 350° C. to 600° C. (in the present preferred embodiment, 600° C.).

In the first preferred embodiment, the opaque cylindrical louver 21 and the ring-shaped light-shielding member 25 having missing portions at radially opposite positions are provided between the halogen heater 4 and the chamber 6 so as to block off part of the light travelling from the halogen heater 4 toward the semiconductor wafer W held by the holder 7. A description will now be given of how light is shielded in the case where a perfect ring-shaped light-shielding member 251 that includes no cut-out portions 29 is provided, instead of the above-described light-shielding member 25. FIG. 10 is a perspective view of the overall external appearance of the cylindrical louver 21 that includes the perfect ring-shaped light-shielding member 251. The light-shielding member 25 of the present preferred embodiment illustrated in FIG. 9 is obtained by forming the cut-out portions 29 at the radially opposite positions of the perfect ring-shaped light-shielding member 251 in FIG. 10. FIG. 11 illustrates how light is shielded by the structure of FIG. 10. As described above, in the present preferred embodiment, the multiple halogen lamps HL are arranged in the region larger than the main surface of the disk-shaped semiconductor wafer W, and the outer diameter of the louver 21 is the same as the diameter of the semiconductor wafer W. Thus, some halogen lamps HL are located outward of the cylindrical louver 21. As illustrated in FIG. 11, part of the light that is emitted from the halogen lamps HL located outward of the louver 21 toward the semiconductor wafer W is blocked off by the opaque louver 21.

The central axis of the ring-shaped light-shielding member 251 coincides with the central axis CX of the louver 21, and the outer diameter of the light-shielding member 251 is smaller than the inner diameter of the louver 21. Thus, there is clearance that allows the light emitted from the halogen lamps HL to pass through it, between the inner wall surface of the louver 21 and the outer circumference of the light-shielding member 251. The light that has been emitted from the halogen lamps HL and passed through the clearance created between the inner wall surface of the louver 21 and the outer circumference of the light-shielding member 251 is radiated to the peripheral portion of the semiconductor wafer W held by the holder 7. This radiation of light from the halogen lamps HL relatively increases the illuminance in the peripheral portion of the semiconductor wafer W, and accordingly the peripheral portion where a temperature drop is likely to occur is heated strongly.

On the other hand, the opaque annular light-shielding member 251, which has an outer diameter of 280 mm and an inner diameter of 260 mm, is located below a region that is slightly inward of the peripheral portion of the semiconductor wafer W held by the holder 7, i.e., below the overheated regions 99 in FIG. 16 that might be generated in the presence of only the louver 21. Thus, light that is emitted from the halogen lamps HL and travels toward the overheated regions 99 that are slightly inward of the peripheral portion of the semiconductor wafer W will be blocked off by the light-shielding member 251. This relatively reduces the illuminance in the overheated regions 99 of the semiconductor wafer W that might be generated in the presence of only the louver 21, and weakens the heating of the overheated regions 99.

However, as illustrated in FIG. 11, the perfect ring-shaped light-shielding member 251 will also block off the light that should originally be applied to a shadow region SA of the semiconductor wafer W, the shadow region SA being a region generated as a result of the louver 21 blocking off part of the light travelling from the halogen lamps HL located outward of the louver 21 toward the semiconductor wafer W. That is, the light-shielding member 251 blocks off the light that should originally travel from the halogen lamps HL located inward of the louver 21 toward the shadow region SA. Note that whether or not the shadow region SA appears in the semiconductor wafer W, as a result of the louver 21 blocking off the light travelling from the halogen lamps HL located outward of the louver 21, depends on the relative positions of the halogen lamps HL, the louver 21, and the semiconductor wafer W. In the case of the positional relationship according to the present preferred embodiment, the shadow region SA will appear as a result of the louver 21 blocking off the light travelling from the outer halogen lamps HL in the lower row of the halogen heater 4, but no shadow regions SA will appear due to the outer halogen lamps HL in the upper row.

The shadow region SA of the semiconductor wafer W where less light reaches from the halogen lamps HL is a low-temperature region (cold spot) that has a lower temperature than the other regions. In the presence of such cold spots, the in-plane temperature distribution of the semiconductor wafer W becomes uneven during flash heating using the flash lamps FL, and degradation of the semiconductor device characterizes and a decrease in yield are of concern.

Figure 12:
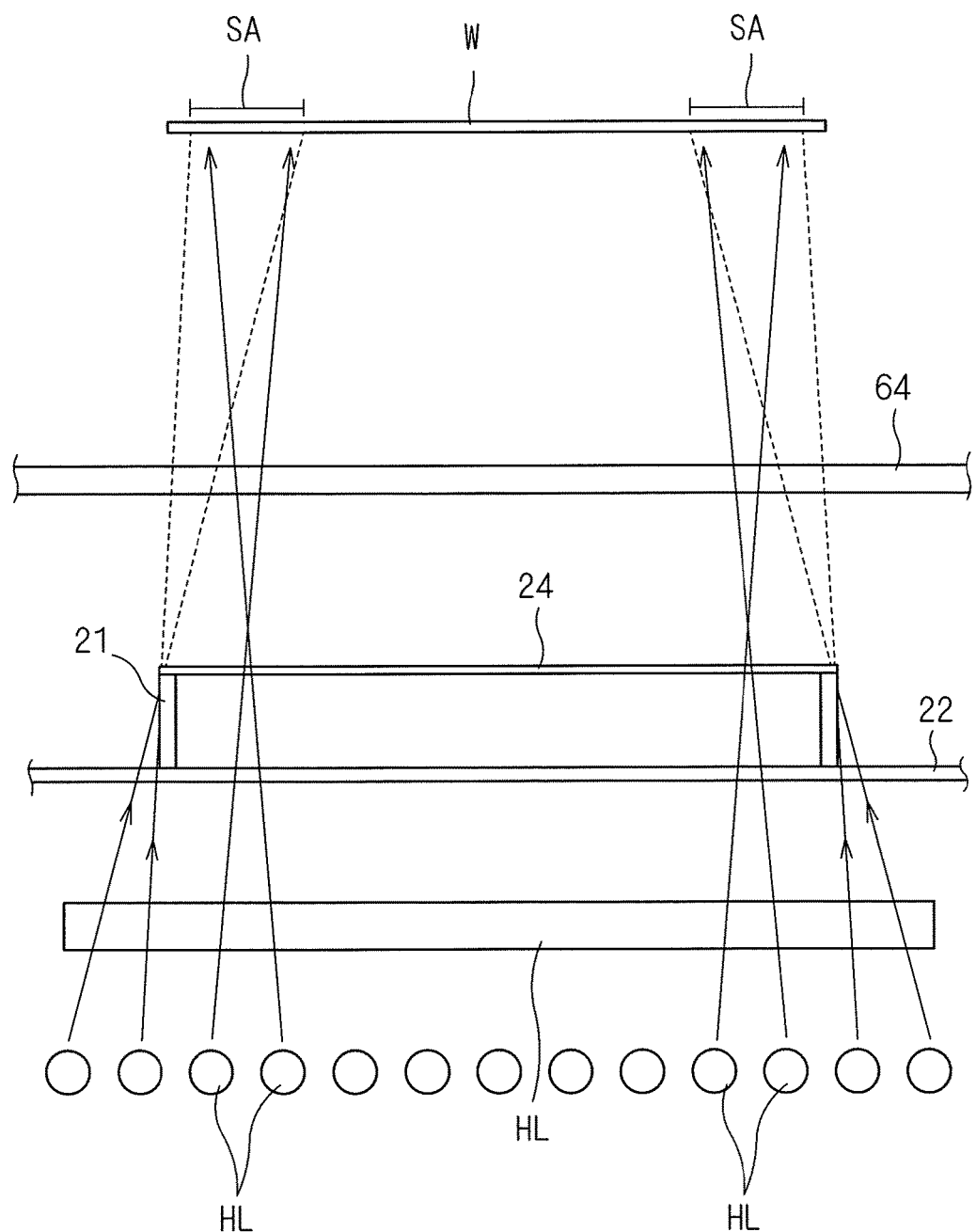
FIG. 12 illustrates how optical paths are adjusted by the louver and the light-shielding member according to the first preferred embodiment.

In view of this, the light-shielding member 25 according to the present invention is a ring-shaped light-shielding ring (light-shielding member 251) having the cut-out portions 29 at the radially opposite positions. FIG. 12 illustrates how optical paths are adjusted by the louver 21 and the light-shielding member 25 according to the first preferred embodiment. FIG. 12 is a side view of an area where the cut-out portions 29 in FIG. 9 are formed.

As illustrated in FIG. 12, in the presence of the light-shielding member 25 with the cut-out portions 29, the light emitted from the halogen lamps HL located inward of the louver 21 will pass through the cut-out portions 29 and reach the shadow region SA of the semiconductor wafer W. That is, the presence of the cut-out portions 29 of the light-shielding member 25 allows light to reach the shadow region SA of the semiconductor wafer W that is shielded from the light emitted from the halogen lamps HL by the louver 21. As a result, the illuminance in the shadow region SA is relatively increased, and the shadow region SA is heated in the same manner as the other regions. Because the shadow region SA appears as a result of the louver 21 blocking off the light emitted from the outer halogen lamps HL in the lower row of the halogen heater 4, the cut-out portions 29 are formed at such positions that allow light to reach the shadow region SA that appears as a result of the light from the outer halogen lamps HL in the lower row being blocked off.

In this way, the combination of the louver 21 and the light-shielding member 25 with the cut-out portions 29 will effectively resolve the problem of unevenness in the in-plane temperature distribution of the semiconductor wafer W during light irradiation using the halogen lamps HL.

After the temperature of the semiconductor wafer W has reached the preheating temperature T1 and a predetermined period of time has elapsed, the flash lamps FL of the flash heater 5 emit flash light to the front surface of the semiconductor wafer W. At this time, part of the flash light emitted from the flash lamps FL travels directly into the chamber 6, and part of the flash light is once reflected by the reflector 52 and then travels into the chamber 6. Thus, flash heating of the semiconductor wafer W is implemented by this application of flash light.

Flash heating, which is implemented by the application of flash light (flashes) from the flash lamps FL, can raise the front surface temperature of the semiconductor wafer W in a short time. That is, the flash light emitted from the flash lamps FL is an extremely short, strong flash of light that is obtained by converting the electrostatic energy stored in advance in the capacitor into an extremely short optical pulse and whose irradiation time is approximately in the range of 0.1 to 100 milliseconds. The front surface temperature of the semiconductor wafer W that is heated with the flash light emitted from the flash lamps FL will rise instantaneously to a processing temperature T2 of 1000° C. or higher and then drop rapidly after the impurities doped in the semiconductor wafer W are activated. In this way, the heat treatment apparatus 1 can raise and drop the front surface temperature of the semiconductor wafer W in an extremely short time, and therefore can activate the impurities doped in the semiconductor wafer W while suppressing the diffusion of the impurities due to heat. Since the time necessary to activate impurities is extremely shorter than the time necessary to diffuse impurities with heat, the activation of impurities will be completed in such a short time (e.g., about 0.1 to 100 milliseconds) that does not cause diffusion.

In the first preferred embodiment, the combination of the louver 21 and the light-shielding member 25 having the cut-out portions 29 will help make uniform the in-plane temperature distribution of the semiconductor wafer W in the stage of preheating by the halogen heater 4 and accordingly make uniform the in-plane temperature distribution of the semiconductor wafer W surface during flash light irradiation.

After the flash heating ends and a predetermined period of time has elapsed, the halogen lamps HL are turned off. The temperature of the semiconductor wafer W thus rapidly drops from the preheating temperature T1. The decreasing temperature of the semiconductor wafer W is measured with the radiation thermometer 120, and the measurement result is transmitted to the controller 3. The controller 3 monitors the measurement result to determine whether the temperature of the semiconductor wafer W has dropped to a predetermined temperature. After the temperature of the semiconductor wafer W has dropped to the predetermined temperature or lower, the pair of transfer arms 11 of the transfer mechanism 10 move horizontally from the retracted positions to the transfer operation positions and upward again, so that the lift pins 12 protrude from the upper surface of the susceptor 74 and receive the heat-treated semiconductor wafer W from the susceptor 74. Then, the transport opening 66 that has been closed by the gate valve 185 is opened, and the semiconductor wafer W placed on the lift pins 12 is transported out of the apparatus by the transport robot. This completes the heat treatment of the semiconductor wafer W in the heat treatment apparatus 1.

In the first preferred embodiment, the opaque cylindrical louver 21 and the light-shielding member 25, which is a ring-shaped light-shielding ring having the cut-out portions 29, are provided between the halogen heater 4 and the chamber 6 so as to adjust the optical paths of light travelling from the halogen heater 4 toward the semiconductor wafer W held by the holder 7. As described previously, in the presence of only the louver 21 and the perfect ring-shaped light-shielding member, the shadow region SA where less light reaches from the halogen lamps HL is likely to appear in the semiconductor wafer W, and accordingly the in-plane temperature distribution tends to become uneven. In view of this, the light-shielding member 25 obtained by forming the cut-out portions 29 in the perfect ring shape is provided to allow the light emitted from the halogen lamps HL located inward of the louver 21 to reach the shadow region SA, and to thereby make uniform the in-plane temperature distribution of the semiconductor wafer W during preheating. As a result, the in-plane temperature distribution of the semiconductor wafer W during flash heating can also be made uniform.

Second Preferred Embodiment

Next, a second preferred embodiment according to the present invention will be described. The overall configuration of the heat treatment apparatus according to the second preferred embodiment is generally similar to that described in the first preferred embodiment. The procedure of processing performed on the semiconductor wafer W according to the second preferred embodiment is also the same as that described in the first preferred embodiment. The second preferred embodiment differs from the first preferred embodiment in that the light-shielding member has transparent portions, instead of cut-out portions.

Figure 13:
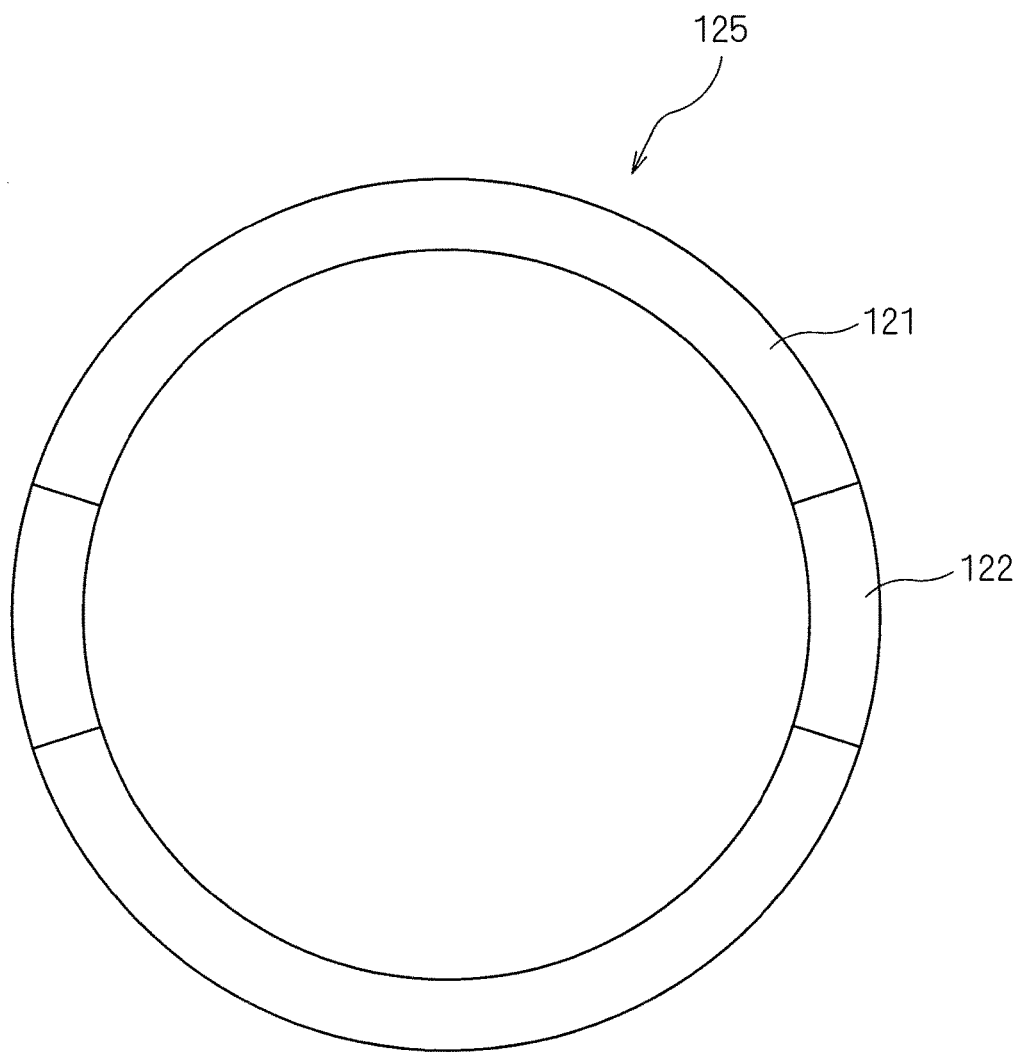
FIG. 13 is a plan view of a light-shielding member according to a second preferred embodiment.

FIG. 13 is a plan view of a light-shielding member 125 according to the second preferred embodiment. While the light-shielding member 25 of the first preferred embodiment is a ring-shaped light-shielding ring having the cut-out portions 29, the light-shielding member 125 of the second preferred embodiment is a ring-shaped light-shielding ring, part of which is made of a member that is transparent to the light emitted from the halogen lamps HL. That is, the light-shielding member 125 of the second preferred embodiment includes a transparent portion 122, which forms part of the ring-shaped flat-plate ring, and an opaque portion 121, which is the remaining part of the ring. The transparent portion 122 is made of, for example, transparent quartz that allows the light emitted from the halogen lamps HL to pass through it, and the opaque portion 121 is made of, for example, opaque quartz similar to that used in the first preferred embodiment. The transparent portion 122 of transparent quartz and the opaque portion 121 of opaque quartz may be bonded to each other by welding. A bonded unit of the opaque portion 121 and the transparent portion 122 has a perfect ring shape. Such a ring-shaped unit may have two transparent portions 122 at radially opposite positions. In other words, the light-shielding member 125 of the second preferred embodiment is obtained by replacing the cut-out portions 29 of the light-shielding member 25 of the first preferred embodiment with transparent quartz.

The size of the light-shielding member 125 is the same as that of the first preferred embodiment, and may have an outer diameter of 280 mm, an inner diameter of 260 mm, and a thickness of 2 mm. This light-shielding member 125 is placed on the upper surface of the ring stage 24 provided at the top of the cylindrical louver 21. The rest of the configuration of the second preferred embodiment, excluding the form of the light-shielding member 125, is the same as that described in the first preferred embodiment.

When, in the second preferred embodiment, the semiconductor wafer W is preheated by the application of light from the halogen heater 4, the light emitted from the halogen lamps HL located inward of the louver 21 will pass through the transparent portions 122, which form part of the light-shielding member 125, and reach the shadow region SA of the semiconductor wafer W. That is, the presence of the transparent portions 122 of the light-shielding member 125 will help light reach the shadow region SA of the semiconductor wafer W that is shielded from the light emitted from the halogen lamps HL by the louver 21. Accordingly, the illuminance in the shadow region SA is relatively increased, and the shadow region SA is heated in the same manner as the other regions. This will help make uniform the in-plane temperature distribution of the semiconductor wafer W during preheating and consequently make uniform the in-plane temperature distribution of the semiconductor wafer W during flash heating.

Third Preferred Embodiment

Next, a third preferred embodiment of the present invention will be described. The overall configuration of a heat treatment apparatus according to the third preferred embodiment is generally similar to that described in the first preferred embodiment. The procedure of processing performed on the semiconductor wafer W according to the third preferred embodiment is also the same as that described in the first preferred embodiment. The third preferred embodiment differs from the first preferred embodiment in the shape of a light-shielding member.

Figure 14:
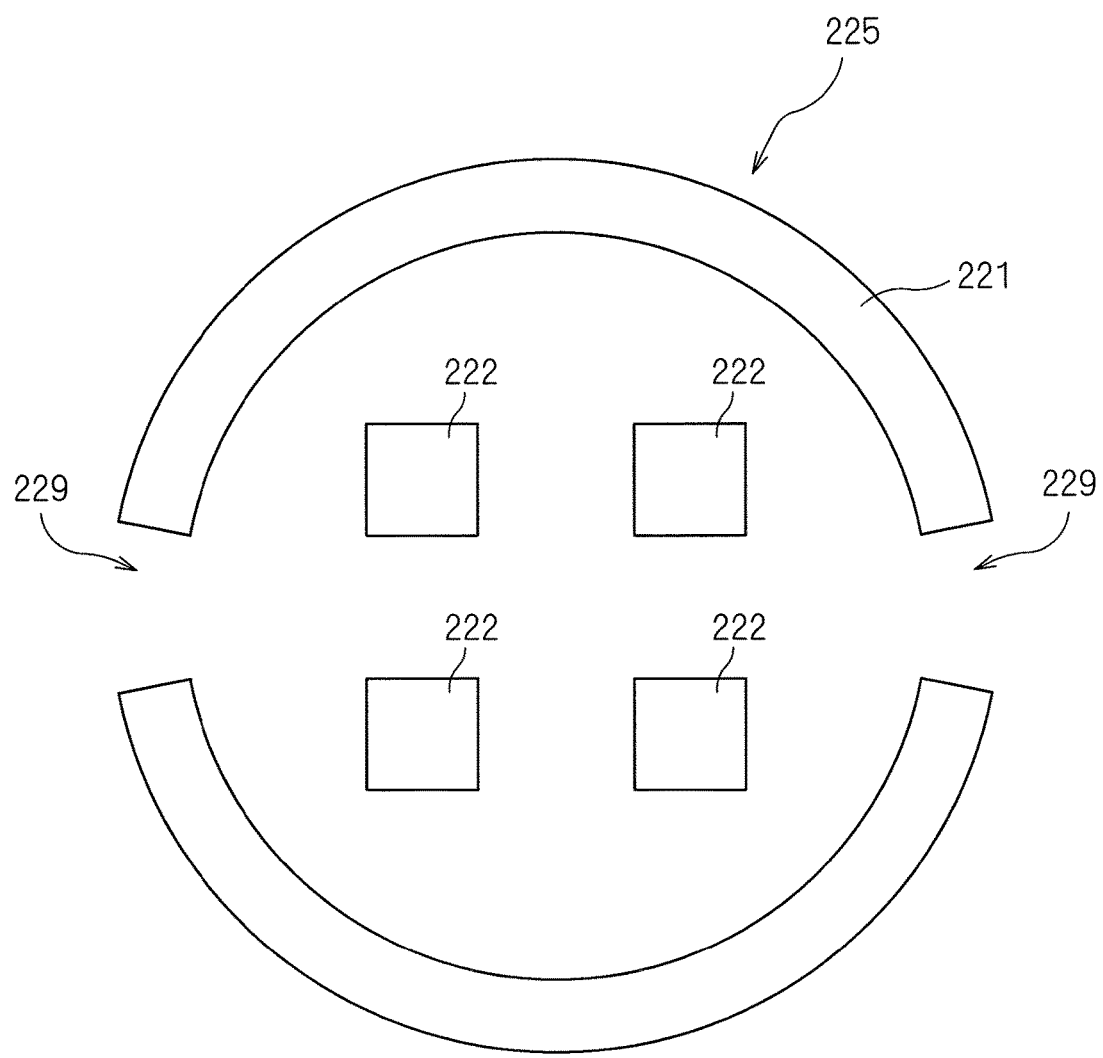
FIG. 14 is a plan view of a light-shielding member according to a third preferred embodiment.

FIG. 14 is a plan view of a light-shielding member 225 according to the third preferred embodiment. The light-shielding member 225 of the third preferred embodiment is configured by multiple light-shieling parts, with four plate-like light-shielding pieces 222 arranged inside a light-shielding ring 221 having cut-out portions 229. The light-shielding ring 221 and the four light-shielding pieces 222, which constitute the light-shielding member 225, are made of a material that is impervious to the light emitted from the halogen lamps HL of the halogen heater 4, and may be made of opaque quartz with a large number of superfine air bubbles contained in silica glass.

The light-shielding ring 221 is similar to the light-shielding member 25 of the first preferred embodiment. That is, the shape of the light-shielding ring 221 is a ring shape having two cut-out portions 229 at radially opposite positions. The outer diameter of the light-shielding ring 221 is smaller than the inner diameter of the cylindrical louver 21. Each light-shielding piece 222 is a rectangular plate-like member of such a size that can be housed inside the light-shielding ring 221. The light-shielding ring 221 and the four light-shielding pieces 222 are placed in the form of arrangement as illustrated in FIG. 14 on the ring stage 24 provided at the top of the cylindrical louver 21. The rest of the configuration of the third preferred embodiment, excluding the shape of the light-shielding member 225, is the same as that described in the first preferred embodiment.

When, in the third preferred embodiment, the semiconductor wafer W is preheated by the application of light from the halogen heater 4, the light emitted from the halogen lamps HL located inward of the louver 21 will pass through the cut-out portions 229, which form part of the light-shielding member 225, and reach the shadow region SA of the semiconductor wafer W. That is, the presence of the cut-out portions 229 of the light-shielding member 225 will help light reach the shadow region SA of the semiconductor wafer W that is shielded from the light emitted from the halogen lamps HL by the louver 21. Accordingly, the illuminance in the shadow region SA is relatively increased, and the shadow region SA is heated in the same manner as the other regions. This will help make uniform the in-plane temperature distribution of the semiconductor wafer W during preheating and consequently make uniform the in-plane temperature distribution of the semiconductor wafer W during flash heating.

In the case where, when preheating using the halogen heater 4 is performed in the presence of only the louver 21, additional overheated regions, in addition to the overheated regions 99 of a shape illustrated in FIG. 16, appear inside the overheated regions 99 in the surface of the semiconductor wafer W, the light-shielding pieces 222 may be provided, in addition to the light-shielding ring 221, as in the third preferred embodiment. This configuration will help individually block off the light travelling toward the overheated regions and accordingly effectively make uniform the in-plane temperature distribution of the semiconductor wafer W.

Fourth Preferred Embodiment

Next, a fourth preferred embodiment according to the present invention will be described. The overall configuration of a heat treatment apparatus according to the fourth preferred embodiment is generally similar to that described in the first preferred embodiment. The procedure of processing performed on the semiconductor wafer W according to the fourth preferred embodiment is also the same as that described in the first preferred embodiment. The fourth preferred embodiment differs from the first preferred embodiment in the shape of a light-shielding member.

FIG. 15 is a plan view of a light-shielding member 325 according to the fourth preferred embodiment. The light-shielding member 325 of the fourth preferred embodiment is constituted by multiple light-shieling parts, with a plate-like light-shielding piece 322 arranged inside a flat square frame-like light-shielding frame 321 having cut-out portions 329. The light-shielding frame 321 and the light-shielding piece 322, which constitute the light-shielding member 325, are made of a material that is impervious to the light emitted from the halogen lamps HL of the halogen heater 4, and may be made of opaque quartz with a large number of superfine air bubbles contained in silica glass.

The diagonal line of the light-shielding frame 321 having a square frame-like shape has a length that is smaller than the inner diameter of the cylindrical louver 21. The shape of the light-shielding frame 321 is obtained by forming the cut-out portions 329 at the centers of two opposite sides among the four sides of the square. The light-shielding piece 322 is a circulate plate-like member having a size that can be housed in the light-shielding frame 321. The light-shielding frame 321 and the light-shielding piece 322 are placed in the form of arrangement as illustrated in FIG. 15 on the upper surface of the ring stage 24 provided at the top of the cylindrical louver 21. The rest of the configuration of the fourth preferred embodiment, excluding the shape of the light-shielding member 325, is the same as that described in the first preferred embodiment.

When, in the fourth preferred embodiment, the semiconductor wafer W is preheated by the application of light from the halogen heater 4, the light emitted from the halogen lamps HL located inward of the louver 21 will pass through the cut-out portions 329 of the light-shielding member 325 and reach the shadow region SA of the semiconductor wafer W. That is, the presence of the cut-out portions 329 of the light-shielding member 325 will help light reach the shadow region SA of the semiconductor wafer W that is shielded from the light emitted from the halogen lamps HL by the louver 21. Accordingly, the illuminance in the shadow region SA is relatively increased, and the shadow region SA is heated in the same manner as the other regions. This will help make uniform the in-plane temperature distribution of the semiconductor wafer W during preheating and consequently make uniform the in-plane temperature distribution of the semiconductor wafer W during flash heating.

In the case where, when preheating using the halogen heater 4 is performed in the presence of only the louver 21, additional overheated regions, in addition to the overheated regions 99 of a shape illustrated in FIG. 16, appear inside the overheated regions 99 in the surface of the semiconductor wafer W, the light-shielding piece 322 may be provided, in addition to the light-shielding frame 321, as in the fourth preferred embodiment. This configuration will help individually block off the light travelling toward the overheated regions and accordingly effectively make uniform the in-plane temperature distribution of the semiconductor wafer W.

Variations

While the above has been a description of preferred embodiments of the present invention, various modifications other than the examples described above are possible without departing from the scope of the invention. For example, while in the above-described preferred embodiments, the light-shielding members 25, 225, and 325 and the opaque portions 121 of the light-shielding member 125 are made of opaque quartz with a large number of superfine air bubbles contained in silica glass, the material for these members is not limited to opaque quartz. For example, the light-shielding members 25, 225, and 325 and the opaque portions 121 of the light-shielding member 125 may be made of a material, such as ceramic or metal, that is impervious to the light emitted from the halogen lamps HL of the halogen heater 4. Opaque materials do not necessarily have to be completely opaque materials (with 0% transmittance), and may be materials that have transmittance of 15% or less with respect to the light emitted from the halogen lamps HL.

The louver 21 and the light-shielding members 25, 125, 225, and 325 may be made of different materials as long as the materials are impervious to the light emitted from the halogen lamps HL. In the third preferred embodiment, the light-shielding ring 221 and the multiple light-shielding pieces 222 may be made of different materials. In this case, each light-shielding piece 222 may have different transmittance with respect to the light emitted from the halogen lamps HL. If overheated regions generated in the surface of the semiconductor wafer W have varying temperatures as a result of preheating in the presence of only the louver 21, the multiple light-shielding pieces 222 may preferably have different transmittance depending on the temperatures of the overheated regions. More specifically, the transmittance of a light-shielding piece 222 that corresponds to an overheated region having a much higher temperature than the other regions may be preferably set to low (as close as 0% transmittance), whereas the transmittance of a light-shielding piece 222 that corresponds to an overheated region having a slightly higher temperature than the other regions may be preferably set to high. In this case, the illuminance in the overheated regions can be adjusted with higher accuracy, and the in-plane temperature distribution of the semiconductor wafer W can be made uniform effectively. In the third preferred embodiment, the light-shielding ring 221 and the multiple light-shielding pieces 222 may of course have different transmittance.

Similarly, the light-shielding frame 321 and the light-shielding piece 322 of the fourth preferred embodiment may be made of different materials. In this case, the light-shielding frame 321 and the light-shielding piece 322 may have different transmittance with respect to the light emitted from the halogen lamps HL.

Also, the shape of the light-shielding member and the number of parts thereof are not limited to the examples described in the first to fourth preferred embodiments. For example, the light-shielding member may have an ellipsoidal shape, a star shape, or a polygonal shape rather than the circular shape. The number of parts of the light-shielding members may be changed appropriately. If the light-shielding members include multiples parts, these parts may be arranged symmetrically or asymmetrically depending on the distribution of overheated regions in the surface of the semiconductor wafer W.

The cut-out portions 229 of the third preferred embodiment and the cut-out portions 329 of the fourth preferred embodiment may be replaced by transparent portions as in the second preferred embodiment. In short, part of the light-shielding members may be either removed, or made transparent by increasing the transmittance.

While in the above-described preferred embodiments, the shadow region SA appears in the semiconductor wafer W as a result of the louver 21 blocking off the light travelling from the outer halogen lamps HL in the lower row of the halogen heater 4, the shadow region SA may appear, depending on the arrangement of the halogen lamps HL or other constituent elements, due to the presence of the outer halogen lamps HL in the upper row. In this case, cut-out portions may be formed at radially opposite positions in a direction that is orthogonal to the diameter across which the cut-out portions 29 are formed in the above-described preferred embodiments. Even in such a case, the light emitted from the halogen lamps HL located inward of the louver 21 will pass through the cut-out portions and reach the shadow region SA of the semiconductor wafer W. Thus, the in-plane temperature distribution of the semiconductor wafer W can be made uniform as in the above-described preferred embodiments. In summary, the cut-out portions (or transparent portions) of a light-shielding member may be provided so as to allow light to reach the shadow region SA of the semiconductor wafer W that is shielded from the light emitted from the halogen heater 4 by the opaque cylindrical louver 21.

While in the above-described preferred embodiments, the flash heater 5 includes 30 flash lamps FL, the present invention is not limited to this example, and the flash heater 5 may include an arbitrary number of flash lamps FL. The flash lamps FL are not limited to xenon flash lamps, and may be krypton flash lamps. The number of halogen lamps HL included in the halogen heater 4 is also not limited to 40, and the halogen heater 4 may include an arbitrary number of halogen lamps HL as long as each of the upper and lower rows includes an array of multiple halogen lamps.

Substrates to be processed by the heat treatment apparatus according to the present invention are not limited to semiconductor wafers, and may be glass substrates for use in flat panel displays such as liquid crystal displays, or may be substrates for solar cells. The technique according to the present invention is also applicable to other applications such as heat treatment of a high dielectric gate insulating film (High-k film), bonding of metal and silicon, and crystallization of polysilicon.

The application of the heat treatment technique according to the present invention is not limited to flash-lamp annealing apparatuses, and this technique is also applicable to, for example, lamp annealing apparatuses using halogen lamps or apparatuses, such as CVD apparatuses, that use different heat sources other than flash lamps. In particular, the technique of the present invention is preferably applicable to backside annealing apparatuses in which halogen lamps are located below a chamber and heat treatment is performed with the light emitted from the rear surface of the semiconductor wafer.

While the invention has been shown and described in detail, the foregoing description is in all aspects illustrative and not restrictive. It is therefore to be understood that numerous modifications and variations can be devised without departing from the scope of the invention.

What is claimed is:

1. A heat treatment apparatus for heating a disk-shaped substrate by irradiating the substrate with light, comprising:
   a chamber that houses a substrate;
   a holder that holds said substrate in said chamber;
   a light irradiation part in which a plurality of rod-shaped lamps are arranged in a light source region that is larger than a major surface of said substrate held by said holder and that faces the major surface;
   a cylindrical louver that is provided between said light irradiation part and said holder, with a central axis of said louver passing through a center of said substrate, and that is impervious to light emitted from said light irradiation part, and an outer diameter of said louver being smaller than said light source region; and
   a light-shielding member that is provided between said light irradiation part and said holder and that is impervious to the light emitted from said light irradiation part,
   wherein said light-shielding member has a cut-out portion that allows light to reach a region of said substrate that is shielded from the light emitted from said light irradiation part by said louver.

2. The heat treatment apparatus according to claim 1, wherein
   said light-shielding member includes:
   a light-shielding ring having said cut-out portion; and
   a light-shielding piece arranged inside said light-shielding ring.

3. A heat treatment apparatus for heating a disk-shaped substrate by irradiating the substrate with light, comprising:
   a chamber that houses a substrate;
   a holder that holds said substrate within said chamber;
   a light irradiation part in which a plurality of rod-shaped lamps are arranged in a light source region that is larger than a major surface of said substrate held by said holder and that faces the major surface;
   a cylindrical louver that is provided between said light irradiation part and said holder, with a central axis of said louver passing through a center of said substrate, and that is impervious to light emitted from said light irradiation part, and an outer diameter of said louver being smaller than said light source region; and
   a light-shielding member that is provided between said light irradiation part and said holder and that is impervious to the light emitted from said light irradiation part,
   wherein part of said light-shielding member is made of a transparent member to allows light to reach a region of said substrate that is shielded from the light emitted from said light irradiation part by said louver.

4. The heat treatment apparatus according to claim 3, wherein
   said part of said light-shielding member is made of transparent quartz, and a remaining part of said light-shielding member is made of opaque quartz.

* * * * *